(12) United States Patent
Umezawa et al.

(10) Patent No.: US 11,979,713 B2
(45) Date of Patent: May 7, 2024

(54) PIEZOELECTRIC DEVICE

(71) Applicant: Murata Manufacturing Co., Ltd., Nagaokakyo (JP)

(72) Inventors: Seiji Umezawa, Nagaokakyo (JP); Matti Liukku, Nagaokakyo (JP); Ville-Pekka Rytkönen, Nagaokakyo (JP); Anssi Blomqvist, Nagaokakyo (JP); Shinsuke Ikeuchi, Nagaokakyo (JP); Fumiya Kurokawa, Nagaokakyo (JP); Masayuki Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 196 days.

(21) Appl. No.: 17/853,979

(22) Filed: Jun. 30, 2022

(65) Prior Publication Data
US 2022/0329951 A1 Oct. 13, 2022

Related U.S. Application Data

(63) Continuation of application No. PCT/JP2021/002408, filed on Jan. 25, 2021.

(30) Foreign Application Priority Data

Jan. 28, 2020 (JP) ................................ 2020-011550

(51) Int. Cl.
*H04R 17/02* (2006.01)
*H10N 30/853* (2023.01)
(52) U.S. Cl.
CPC ......... *H04R 17/02* (2013.01); *H10N 30/8542* (2023.02)

(58) Field of Classification Search
CPC .............................. H04R 17/02; H04R 17/025
(Continued)

(56) References Cited

U.S. PATENT DOCUMENTS

| 2012/0216613 | A1* | 8/2012 | Honda | ............... | G01C 19/5747 |
|---|---|---|---|---|---|
| | | | | | 73/504.15 |
| 2014/0090470 | A1* | 4/2014 | Fujimoto | ........... | G01C 19/5684 |
| | | | | | 310/366 |

(Continued)

FOREIGN PATENT DOCUMENTS

| JP | 2012177610 A | 9/2012 |
|---|---|---|
| JP | 5491080 B2 | 5/2014 |

(Continued)

OTHER PUBLICATIONS

International Search Report in PCT/JP2021/002408, mailed Mar. 16, 2021, 3 pages.

(Continued)

*Primary Examiner* — Sunita Joshi
(74) *Attorney, Agent, or Firm* — Keating & Bennett, LLP

(57) ABSTRACT

A piezoelectric device includes a connecting section connecting a pair of beam sections adjacent to each other. The connecting section is connected to one of the pair of beam sections at a first end portion. The connecting section is connected to another of the pair of beam sections at a second end portion. The second end portion faces the first end portion in a direction in which the pair of beam sections are aligned. A second coupling portion is located along a first coupling portion. The connecting section includes only one first end portion. The connecting section includes only one second end portion. Each of the first end portion and the second end portion is closer to a tip end portion than to a fixed end portion of each of the pair of beam sections.

20 Claims, 15 Drawing Sheets

(58) Field of Classification Search
USPC .......................................................... 381/190
See application file for complete search history.

(56) References Cited

U.S. PATENT DOCUMENTS

2019/0110132 A1 4/2019 Littrell
2021/0202824 A1 7/2021 Kurokawa et al.

FOREIGN PATENT DOCUMENTS

| JP | 2017022576 A | 1/2017 |
| WO | 2013005625 A1 | 1/2013 |
| WO | 2020121609 A1 | 6/2020 |

OTHER PUBLICATIONS

Written Opinion in PCT/JP2021/002408, mailed Mar. 16, 2021, 5 pages.

* cited by examiner

AXIAL DIRECTION OF VIRTUAL AXIS

AXIAL DIRECTION OF VIRTUAL AXIS

PIEZOELECTRIC DEVICE

CROSS REFERENCE TO RELATED APPLICATIONS

This application claims the benefit of priority to Japanese Patent Application No. 2020-011550 filed on Jan. 28, 2020 and is a Continuation Application of PCT Application No. PCT/JP2021/002408 filed on Jan. 25, 2021. The entire contents of each application are hereby incorporated herein by reference.

BACKGROUND OF THE INVENTION

1. Field of the Invention

The present invention relates to piezoelectric devices.

2. Description of the Related Art

U.S. Patent Application Publication No. 2019/0110132 and Japanese Patent No. 5491080 disclose configurations of piezoelectric devices. The piezoelectric device described in U.S. Patent Application Publication No. 2019/0110132 is an acoustic transducer and includes a plurality of plates and a plurality of springs. The acoustic transducer has a gap, which controls the geometry. Each of the plurality of springs is a gap-reducing spring connecting two adjacent plates. A spring arm includes portions surrounding the etched portions of the plate. Adjacent plates can include a distance from a tip of the plates to the center of the springs.

The piezoelectric device described in Japanese Patent No. 5491080 is a microphone and includes a support frame, a first diaphragm, a second diaphragm, and a coupling body. One end of each of the first diaphragm and the second diaphragm is elastically supported by the support frame. Another end of the first diaphragm and another end of the second diaphragm are disposed to face each other. The other end of the first diaphragm and the other end of the second diaphragm are coupled by the coupling body. The coupling body is movably coupled to the other end of the first diaphragm and the other end of the second diaphragm, thereby performing parallel vibration or tilt vibration in accordance with vibration of the first diaphragm or the second diaphragm. The coupling body is a thin plate.

The piezoelectric device disclosed in U.S. Patent Application Publication No. 2019/0110132 includes a connecting section that connects beam sections adjacent to each other among a plurality of beam sections such as diaphragms or plates. Thus, vibration variation of each of the plurality of beam sections is reduced. In the piezoelectric device disclosed in Japanese Patent No. 5491080, the diaphragms as the beam sections are connected to each other by the coupling body as the connecting section. Thus, each beam section is vibrated with a phase difference. However, in these conventional piezoelectric devices, the connection between the beam sections by the connecting section may be too strong due to stress generated in the direction in which the connecting section pulls the beam sections. When the connection is too strong, each of the plurality of beam sections becomes stiffer, and the resonant frequency of the vibration of each of the plurality of beam sections becomes higher.

SUMMARY OF THE INVENTION

Preferred embodiments of the present invention provide piezoelectric devices that each reduce or prevent vibration variation of each of a plurality of beam sections while reducing or preventing an increase in resonant frequency of each of the plurality of beam sections during vibration.

A piezoelectric device according to a preferred embodiment of the present invention includes a base, a plurality of beam sections, and a connecting section. Each of the plurality of beam sections includes a fixed end portion and a tip end portion. The fixed end portion is connected to the base. The tip end portion is located on a side opposite to the fixed end portion. Each of the plurality of beam sections extends from the fixed end portion toward the tip end portion. Each of the plurality of beam sections is a piezoelectric vibrating section including a plurality of layers. The connecting section connects a pair of beam sections adjacent to each other of the plurality of beam sections. A first slit and a second slit are provided between the pair of beam sections. The first slit is defined by portions of a pair of end edges adjacent to each other of the pair of beam sections. The second slit is defined by other portions of the pair of end edges adjacent to each other of the pair of beam sections at a position different from that of the first slit. The connecting section is located at least between the first slit and the second slit. The connecting section includes a first end portion, a second end portion, a bridging portion, a first coupling portion, and a second coupling portion. The connecting section is connected to one of the pair of beam sections at the first end portion. The connecting section is connected to another of the pair of beam sections at the second end portion. The second end portion faces the first end portion in a direction in which the pair of beam sections are aligned. The bridging portion connects the pair of beam sections while turning back between the pair of beam sections. The first coupling portion is connected to a portion of the bridging portion on the side of the one of the pair of beam sections. The second coupling portion is connected to a portion of the bridging portion on the side of the other of the pair of beam sections. The second coupling portion is located along the first coupling portion. The connecting section includes only one first end portion. The connecting section includes only one second end portion. Each of the first end portion and the second end portion is closer to the tip end portion than to the fixed end portion of each of the pair of beam sections.

According to preferred embodiments of the present invention, it is possible to reduce or prevent vibration variation of each of the plurality of beam sections while reducing or preventing an increase in resonant frequency of each of the plurality of beam sections during vibration.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
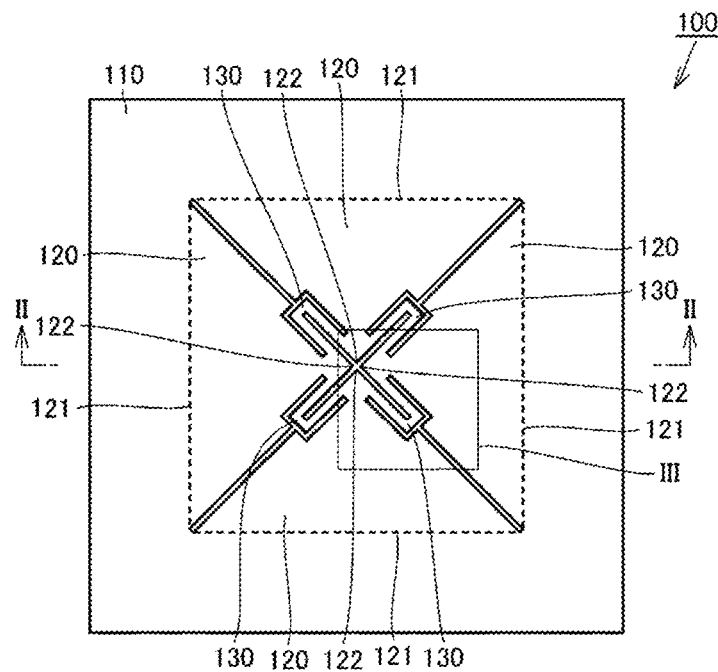
FIG. 1 is a plan view of a piezoelectric device according to Preferred Embodiment 1 of the present invention.

Hereinafter, piezoelectric devices according to preferred embodiments of the present invention will be described with reference to the drawings. In the following description of the embodiments, the same or equivalent portions in the drawings are denoted by the same reference signs, and description thereof will not be repeated.

Preferred Embodiment 1

Figure 2:
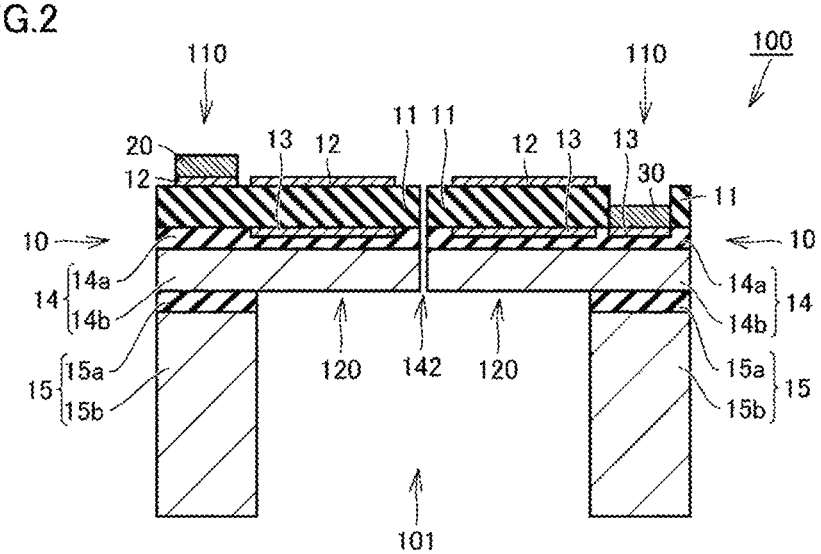
FIG. 2 is a sectional view of the piezoelectric device illustrated in FIG. 1 taken along line II-II.
Figure 3:
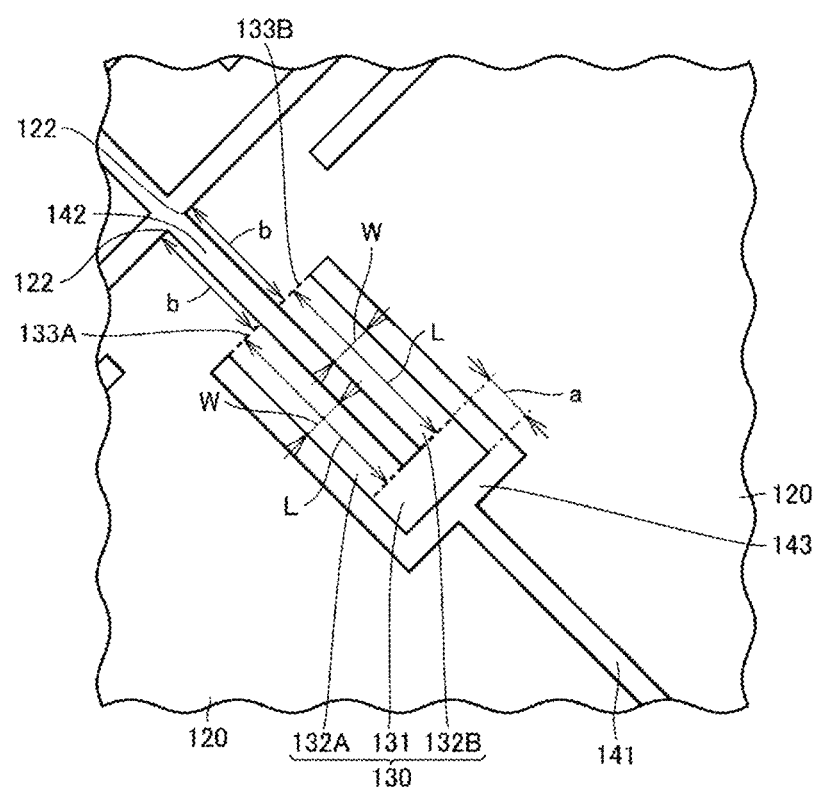
FIG. 3 is an enlarged partial plan view of part III in FIG. 1.

FIG. 1 is a plan view of a piezoelectric device according to Preferred Embodiment 1 of the present invention. FIG. 2 is a sectional view of the piezoelectric device illustrated in FIG. 1 taken along line II-II. FIG. 3 is an enlarged partial plan view of part III in FIG. 1.

As illustrated in FIGS. 1 to 3, a piezoelectric device 100 according to Preferred Embodiment 1 of the present invention includes a base 110, a plurality of beam sections 120, and a plurality of connecting sections 130. The piezoelectric device 100 according to the present preferred embodiment in which each of the plurality of beam sections 120 is capable of flexural vibration can be used as, for example, an ultrasonic transducer.

As illustrated in FIG. 1, the base 110 is connected to a fixed end portion 121 of each of the plurality of beam sections 120. When viewed from a laminating direction of a plurality of layers described later, the base 110 has an annular outer shape and specifically has a rectangular or substantially rectangular annular outer shape. Note that the outer shape of the base 110 when viewed from the laminating direction is not limited to a specific shape. The base 110 having the annular outer shape may have, for example, a polygonal or substantially polygonal or a circular or substantially circular outer peripheral side surface or a polygonal or substantially polygonal or a circular or substantially circular inner peripheral side surface when viewed from the laminating direction.

As illustrated in FIG. 2, each of the plurality of beam sections 120 is a piezoelectric vibrating section including a plurality of layers 10. In FIG. 1, each of the plurality of layers is not illustrated. The configuration of the plurality of layers 10 will be described in detail later.

As illustrated in FIG. 1, each of the plurality of beam sections 120 includes the fixed end portion 121 and a tip end portion 122. The fixed end portion 121 is connected to the base 110. The fixed end portions 121 of the plurality of beam sections 120 are each located in the same or substantially the same virtual plane. The fixed end portions 121 of the plurality of beam sections 120 are each connected to the inner peripheral surface of the annular base 110 when viewed from the laminating direction. The fixed end portions 121 of the plurality of beam sections 120 are each adjacent to each other on the inner peripheral surface when viewed from the laminating direction. In the present preferred embodiment, the fixed end portions 121 of the plurality of beam sections 120 are located in one-to-one correspondence with a plurality of sides of the rectangular or substantially rectangular annular inner peripheral surface of the base 110, respectively, when viewed from the laminating direction.

In the present preferred embodiment, the tip end portions 122 of the plurality of beam sections 120 are each located in the vicinity of the center of the annular base 110 when viewed from the laminating direction. Each of the plurality of beam sections 120 extends from the fixed end portion 121 toward the tip end portion 122. That is, in an extending direction of each of the plurality of beam sections 120, the tip end portion 122 is located at an end portion opposite to the fixed end portion 121. In the present preferred embodiment, the plurality of beam sections 120 each extends along the same or substantially the same virtual plane when the piezoelectric device 100 is not driven.

As illustrated in FIG. 1, each of the plurality of beam sections 120 has an outer shape in which the tip end portion 122 tapers when viewed from the laminating direction. Specifically, each of the plurality of beam sections 120 has a triangular or substantially triangular outer shape when viewed from the laminating direction. When each of the plurality of beam sections 120 has an outer shape in which the tip end portion 122 tapers, the extending direction of each of the plurality of beam sections 120 is a direction connecting the center of the fixed end portion 121 and the tip end portion 122. In the present preferred embodiment, this triangular or substantially triangular shape is an isosceles triangle or a substantially isosceles triangle shape with the fixed end portion 121 as the base and the apex located at the tip end portion 122. That is, in the present preferred embodiment, the extending direction of each of the plurality of beam sections 120 is a direction connecting the midpoint of the base and the apex of the isosceles triangle or substantially isosceles triangle, which is the outer shape of each of the plurality of beam sections 120, to each other. In the present preferred embodiment, length of each of the plurality of beam sections 120 in the extending direction is preferably, for example, at least five times or more a dimension of the thickness of each of the plurality of beam sections 120 in the laminating direction from the viewpoint of facilitating flexural vibration. In FIG. 2, the thickness of each of the plurality of beam sections 120 is schematically illustrated.

As illustrated in FIGS. 1 and 3, the connecting section 130 connects a pair of beam sections 120 adjacent to each other among the plurality of beam sections 120. The connecting section 130 includes a first end portion 133A and a second end portion 133B. The connecting section 130 is connected to one of the pair of beam sections 120 at the first end portion 133A. The connecting section 130 is connected to another of the pair of beam sections 120 at the second end portion 133B. The second end portion 133B faces the first end portion 133A in the direction in which the pair of beam sections 120 are aligned. In the present preferred embodiment, the connecting section 130 includes only one first end portion 133A and only one second end portion 133B.

The connecting section 130 includes a bridging portion 131, a first coupling portion 132A, and a second coupling portion 132B. In the present preferred embodiment, the bridging portion 131 connects the pair of beam sections 120 to each other by interposing at least the first coupling portion 132A and the second coupling portion 132B between the bridging portion 131 and the pair of beam sections 120, respectively, while turning back between the pair of beam sections 120. In the present preferred embodiment, in the connecting section 130, the bridging portion 131 extends along a direction in which the first coupling portion 132A and the second coupling portion 132B adjacent to each other are aligned.

In the connecting section 130, the first coupling portion 132A is connected to a portion of the bridging portion 131 located on the side of the one of the pair of beam sections 120. In the connecting section 130, the second coupling portion 132B is connected to a portion of the bridging portion 131 located on the side of the other of the pair of beam sections 120, and is located along the first coupling portion 132A.

The first coupling portion 132A extends, starting from the first end portion 133A, from the one of the pair of beam sections 120 along a second slit 142 described later. The second coupling portion 132B extends, starting from the second end portion 133B, from the other of the pair of beam sections 120 along the second slit 142. In the present preferred embodiment, extension lengths of the first coupling portion 132A and the second coupling portion 132B are equal or substantially equal to each other. In the present preferred embodiment, the first coupling portion 132A is directly connected to the bridging portion 131 on the side opposite to the first end portion 133A side. That is, in the present preferred embodiment, the first coupling portion 132A directly connects the bridging portion 131 and directly connects the one of the pair of beam sections 120 at the first end portion 133A. The second coupling portion 132B is directly connected to the bridging portion 131 on the side opposite to the second end portion 133B side. That is, in the present preferred embodiment, the second coupling portion 132B directly connects the bridging portion 131 and directly connects the other of the pair of beam sections 120 at the second end portion 133B. As illustrated in FIGS. 1 and 3, the first end portion 133A and the second end portion 133B are located closer to the tip end portions 122 than to the fixed end portions 121 of the pair of beam sections 120, respectively.

As illustrated in FIG. 3, in the present preferred embodiment, when viewed from a laminating direction of the plurality of layers 10, the dimensions of extension lengths L of the first coupling portion 132A and the second coupling portion 132B, which are the lengths of the paths along which the first coupling portion 132A and the second coupling portion 132B extend toward connection locations with the bridging portion 131, are the same or substantially the same as each other. When viewed from the laminating direction, the dimensions of minimum widths W of the first coupling portion 132A and the second coupling portion 132B are the same or substantially the same as each other in a direction orthogonal or substantially orthogonal to the direction along the paths in which the first coupling portion 132A and the second coupling portion 132B extend toward the connection locations with the bridging portion 131. The dimensions of the extension lengths L of the first coupling portion 132A and the second coupling portion 132B are larger than the dimensions of the minimum widths W of the first coupling portion 132A and the second coupling portion 132B, respectively, when viewed from the laminating direction. When viewed from the laminating direction, the dimensions of the extension lengths L of the first coupling portion 132A and the second coupling portion 132B are larger than the dimensions of shortest lengths b from the connecting section 130 to the tip end portions 122, respectively. When viewed from the laminating direction of the plurality of layers 10, the dimensions of the extension lengths L of the first coupling portion 132A and the second coupling portion 132B are larger than the dimension of a maximum width a of the bridging portion 131 in the direction orthogonal to the direction in which the pair of beam sections 120 face each other. When viewed from the laminating direction of the plurality of layers 10, the dimension of the maximum width a of the bridging portion 131 is larger than the dimensions of the minimum widths W of the first coupling portion 132A and the second coupling portion 132B.

In addition, the smaller the dimensions of the extension lengths L of the first coupling portion 132A and the second coupling portion 132B, the more firmly the pair of beam sections 120 are connected to each other and the smaller the vibration variation of the pair of beam sections 120. In addition, the larger the dimensions of the extension lengths L of the first coupling portion 132A and the second coupling portion 132B, the lower the resonant frequencies of the vibrations of the pair of beam sections can be. The larger the dimensions of the minimum widths W of the first coupling portion 132A and the second coupling portion 132B, the more firmly the pair of beam sections 120 are connected to each other. The smaller the dimensions of the shortest lengths b from the connecting section 130 to the tip end portions 122, the more firmly the pair of beam sections 120 are connected to each other. The dimension of the maximum width a of the bridging portion 131 affects the resonant frequency of the connecting section 130 when the connecting section 130 vibrates.

In the present preferred embodiment, the dimensions of the extension lengths L of the first coupling portion 132A and the second coupling portion 132B are, for example, about 10 μm or more and about 200 μm or less. The dimensions of the minimum widths W of the first coupling portion 132A and the second coupling portion 132B are, for example, about 10 μm. The dimensions of the shortest lengths b from the connecting section 130 to the tip end portion 122 are, for example, about 25 μm. The dimension of the maximum width a of the bridging portion 131 is, for example, about 15 μm.

Further, as illustrated in FIGS. 1 and 3, a first slit 141, the second slit 142, and an outer peripheral slit 143 are provided between the pair of beam sections 120.

In the present preferred embodiment, the first slit 141 is defined by portions of a pair of end edges adjacent to each other of the pair of beam sections 120. The second slit 142 is defined by other portions of the pair of end edges adjacent to each other of the pair of beam sections 120 at a position different from that of the first slit 141. Specifically, the first slit 141 and the second slit 142 are located along a virtual straight line extending from one of both end points of the fixed end portion 121 of each of the pair of beam sections 120 toward the tip end portion 122 when viewed from the laminating direction. The connecting section 130 is located at least between the first slit 141 and the second slit 142.

In the present preferred embodiment, the first slit 141 is located on the fixed end portion 121 side of each of the pair of beam sections 120 with respect to the bridging portion 131. The second slit 142 is located on the tip end portion 122 side of each of the pair of beam sections 120 with respect to the bridging portion 131. Each of the first coupling portion 132A and the second coupling portion 132B extends along a direction in which each of the first slit 141 and the second slit 142 extends. In the present preferred embodiment, the second slit 142 is located on the inner peripheral side of a turn of the connecting section 130 at the bridging portion 131. The second slit 142 is located between the first coupling portion 132A and the second coupling portion 132B. A portion of the second slit 142 located between the first coupling portion 132A and the second coupling portion 132B is defined by an end edge of the first coupling portion 132A and an end edge of the second coupling portion 132B. That is, in the present preferred embodiment, the first end portion 133A and the second end portion 133B face each other with the second slit 142 in between in the direction in which the pair of beam sections 120 are aligned.

In the present preferred embodiment, the outer peripheral slit 143 is defined at least by an end edge on the outer peripheral side of the turn of the connecting section 130 at the bridging portion 131 and end edges of the pair of beam sections 120. The first slit 141 is connected to the outer peripheral slit 143. To be more specific, the outer peripheral slit 143 is continuously located up to between the first coupling portion 132A and the one of the pair of beam sections 120. The outer peripheral slit 143 is continuously located up to between the second coupling portion 132B and the other of the pair of beam sections 120.

More specifically, the outer peripheral slit 143 further extends from the connecting portion with the first slit 141 in a direction orthogonal or substantially orthogonal to the direction in which the first slit 141 extends, and extend around to both end sides in the extending direction of the bridging portion 131. The outer peripheral slit 143 extends parallel or substantially parallel to the second slit 142 from one of both ends of the bridging portion 131 in the extending direction toward a position adjacent to the first end portion 133A. The outer peripheral slit 143 extends parallel or substantially parallel to the second slit 142 from another of both ends of the bridging portion 131 in the extending direction toward a position adjacent to the second end portion 133B. That is, the outer peripheral slit 143 has a U-shaped or substantially U-shaped outer shape so as to surround a portion of the second slit 142 located on the first slit 141 side.

The width of each of the first slit 141, the second slit 142, and the outer peripheral slit 143 when viewed from the laminating direction is preferably, for example, about 10 μm or less, and more preferably about 1 μm or less.

In the present preferred embodiment, when viewed from the laminating direction, each of the bridging portion 131, the first coupling portion 132A, and the second coupling portion 132B has a rectangular or substantially rectangular outer shape. However, the outer shape of each of the bridging portion 131, the first coupling portion 132A, and the second coupling portion 132B is not limited to a specific shape. When viewed from the laminating direction, the outer shape of each of the first coupling portion 132A and the second coupling portion 132B may have an elliptical or substantially elliptical shape or a polygonal or substantially polygonal shape. In each of the bridging portion 131, the first coupling portion 132A, and the second coupling portion 132B, a side surface extending in the laminating direction may be curved when viewed from the laminating direction.

Figure 4:
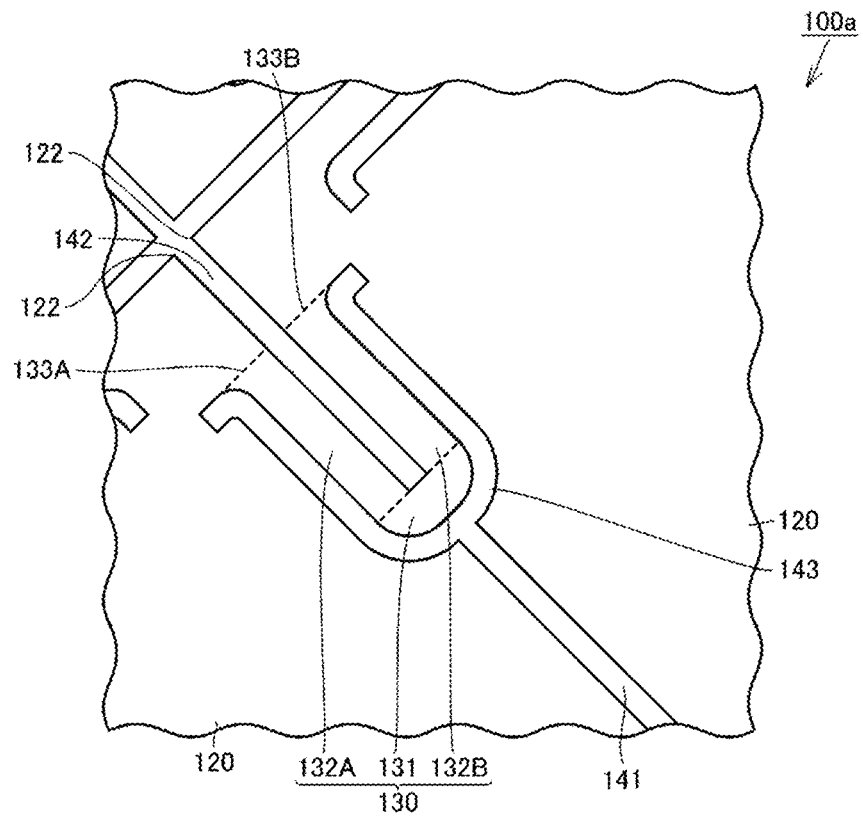
FIG. 4 is a partial plan view of a piezoelectric device according to a first modification of Preferred Embodiment 1 of the present invention.

FIG. 4 is a partial plan view of a piezoelectric device according to a first modification of Preferred Embodiment 1 of the present invention. FIG. 4 illustrates a portion similar to the piezoelectric device 100 according to Preferred Embodiment 1 of the present invention illustrated in FIG. 1. As illustrated in FIG. 4, in a piezoelectric device 100a according to the first modification of Preferred Embodiment 1 of the present invention, the side surface of the bridging portion 131 which is located on the outer peripheral side of the turn of the connecting section 130 and extends in the laminating direction is curved when viewed from the laminating direction. In addition, in the first coupling portion 132A, the side surface is curved in the vicinity of the first end portion 133A on the side of the beam section 120 directly connected to the first coupling portion 132A of the pair of beam sections 120 when viewed from the laminating direction. In the second coupling portion 132B, the side surface is curved in the vicinity of the second end portion 133B on the side of the beam section 120 directly connected to the second coupling portion 132B of the pair of beam sections 120 when viewed from the laminating direction. To be specific, the side surface of the first coupling portion 132A is curved when viewed from the laminating direction so that the width of the first coupling portion 132A in the direction orthogonal or substantially orthogonal to the extension direction increases toward the first end portion 133A. The side surface of the second coupling portion 132B is curved when viewed from the laminating direction so that the width of the second coupling portion 132B in the direction orthogonal or substantially orthogonal to the extension direction increases toward the second end portion 133B. This curvature of the side surface of the bridging portion 131 can reduce internal stress in the connecting section 130.

As illustrated in FIG. 1, the piezoelectric device 100 according to Preferred Embodiment 1 of the present invention includes four beam sections 120 as the plurality of beam sections 120 and four connecting sections 130 as the plurality of connecting sections 130. The four beam sections 120 are each located along the same or substantially the same plane. The four beam sections 120 each extend toward the virtual center point and are adjacent to each other in the circumferential direction around the virtual center point. Each of the four connecting sections 130 is located between the beam sections 120 adjacent to each other among the four beam sections 120 and connects the pair of beam sections 120 adjacent to each other.

In the present preferred embodiment, the four beam sections 120 are configured to be rotationally symmetric or substantially rotationally symmetric around the virtual center point when viewed from the laminating direction. The four connecting sections 130 are also configured to be rotationally symmetric or substantially rotationally symmetric around the virtual center point when viewed from the laminating direction.

Next, the plurality of layers 10 will be described. As illustrated in FIG. 2, in the present preferred embodiment, the plurality of layers 10 includes a piezoelectric layer 11, a first electrode layer 12, and a second electrode layer 13.

The piezoelectric layer 11 is made of a single crystal piezoelectric material. A cut orientation of the piezoelectric layer 11 is appropriately selected so as to have desired device characteristics. In the present preferred embodiment, the piezoelectric layer 11 is a thinned single crystal substrate, and the single crystal substrate is specifically, for example, a rotated Y-cut substrate. The cut orientation of the rotated Y-cut substrate is specifically, for example, about 30°. The thickness of the piezoelectric layer 11 is, for example, about 0.3 μm or more and about 5.0 μm or less. The single crystal piezoelectric material has a polarization axis. An axial direction of the polarization axis will be described in detail later.

The material of the piezoelectric layer 11 is appropriately selected so that the piezoelectric device 100 has desired device characteristics. In the present preferred embodiment, the piezoelectric layer 11 is made of, for example, an inorganic material. Specifically, the piezoelectric layer 11 is made of, for example, an alkali niobate-based compound or an alkali tantalate-based compound. In the present preferred embodiment, the alkali metal included in the alkali niobate-based compound or the alkali tantalate-based compound is, for example, at least one of lithium, sodium, and potassium. In the present preferred embodiment, the piezoelectric layer 11 is made of, for example, lithium niobate ($LiNbO_3$) or lithium tantalate ($LiTaO_3$).

As illustrated in FIG. 2, the first electrode layer 12 is disposed on one side of the piezoelectric layer 11 in the laminating direction of the plurality of layers 10. The second electrode layer 13 is disposed on another side of the piezoelectric layer 11 so as to face at least a portion of the first electrode layer 12 with the piezoelectric layer 11 in between. In addition, in the present preferred embodiment, adhesion layers (not illustrated) are disposed between the first electrode layer 12 and the piezoelectric layer 11, and between the second electrode layer 13 and the piezoelectric layer 11. In each of the plurality of beam sections 120, both of the first electrode layer 12 and the second electrode layer 13 are provided so as not to face all the first slit 141, the second slit 142, and the outer peripheral slit 143.

In the present preferred embodiment, each of the first electrode layer 12 and the second electrode layer 13 is made of, for example, Pt. Each of the first electrode layer 12 and the second electrode layer 13 may be made of another material such as, for example, Al. The adhesion layer is made of, for example, Ti. The adhesion layer may be made of another material such as, for example, NiCr. Each of the first electrode layer 12, the second electrode layer 13, and the adhesion layer may be an epitaxial growth film. For example, when the piezoelectric layer 11 is made of lithium niobate ($LiNbO_3$), the adhesion layer is preferably made of NiCr from the viewpoint of reducing or preventing diffusion of the material of the adhesion layer into the first electrode layer 12 or the second electrode layer 13. Accordingly, the reliability of the piezoelectric device 100 is improved.

In the present preferred embodiment, the thickness of each of the first electrode layer 12 and the second electrode layer 13 is, for example, about 0.05 μm or more and about 0.2 μm or less. The thickness of the adhesion layer is, for example, about 0.005 μm or more and about 0.05 μm or less.

The plurality of layers 10 further includes a support layer 14. The support layer 14 is disposed on the side opposite to the first electrode layer 12 side of the piezoelectric layer 11 and on the side opposite to the piezoelectric layer 11 side of the second electrode layer 13. The support layer 14 includes a first support portion 14a and a second support portion 14b laminated on the first support portion 14a on the side opposite to the piezoelectric layer 11 side. In the present preferred embodiment, for example, the first support portion 14a is made of $SiO_2$, and the second support portion 14b is made of single crystal Si. In the present preferred embodiment, the thickness of the support layer 14 is preferably thicker than that of the piezoelectric layer 11 from the viewpoint of the flexural vibration of the plurality of beam sections 120. The mechanism of the flexural vibration of the plurality of beam sections 120 will be described later.

Further, as illustrated in FIG. 2, in the present preferred embodiment, the connecting section 130 is configured such that the plurality of layers 10 defining each of the plurality of beam sections 120 is continuous in a direction orthogonal or substantially orthogonal to the laminating direction. However, in the present preferred embodiment, the plurality of layers 10 in the connecting section 130 do not include the first electrode layer 12 and the second electrode layer 13.

Further, members defining the base 110 will be described. As illustrated in FIG. 2, in the present preferred embodiment, the base 110 includes the plurality of layers 10 similar to those included in the plurality of beam sections 120. The plurality of layers 10 of the base 110 is configured to be continuous with the plurality of layers 10 of each of the plurality of beam sections 120. Specifically, the piezoelectric layer 11, the first electrode layer 12, the second electrode layer 13, and the support layer 14 defining the base 110 are configured to be continuous with the piezoelectric layers 11, the first electrode layers 12, the second electrode layers 13, and the support layers 14 defining the plurality of beam sections 120, respectively. The base 110 further includes a substrate layer 15, a first connection electrode layer 20, and a second connection electrode layer 30.

The substrate layer 15 is connected to the support layer 14 on the side opposite to the piezoelectric layer 11 side in the axial direction of the central axis. The substrate layer 15 includes a first substrate layer 15a and a second substrate layer 15b laminated on the first substrate layer 15a on the side opposite to the support layer 14 side in the axial direction of the center axis. In the present preferred embodiment, for example, the first substrate layer 15a is made of $SiO_2$, and the second substrate layer 15b is made of single crystal Si.

As illustrated in FIG. 2, the first connection electrode layer 20 is exposed to the outside while being electrically connected to the first electrode layer 12 with an adhesion layer (not illustrated) interposed therebetween. Specifically, the first connection electrode layer 20 is disposed on the side opposite to the support layer 14 side of the first electrode layer 12 in the base 110.

The thickness of each of the first connection electrode layer 20 and the second connection electrode layer 30 is, for example, about 0.1 μm or more and about 1.0 μm or less. The thickness of each of the adhesion layer connected to the first connection electrode layer 20 and the adhesion layer connected to the second connection electrode layer 30 is, for example, about 0.005 μm or more and about 0.1 μm or less.

In the present preferred embodiment, each of the first connection electrode layer 20 and the second connection electrode layer 30 is made of, for example, Au. The first connection electrode layer 20 and the second connection electrode layer 30 may be made of another conductive material such as, for example, Al. Each of the adhesion layer connected to the first connection electrode layer 20 and the adhesion layer connected to the second connection electrode layer 30 is made of, for example, Ti. These adhesion layers may be made of, for example, NiCr.

As illustrated in FIG. 2, the piezoelectric device 100 according to the present preferred embodiment includes a cavity 101, which opens on the side opposite to the piezoelectric layer 11 side in the laminating direction. In the present preferred embodiment, the cavity 101 is a space surrounded by the base 110, the plurality of beam sections 120, the plurality of connecting sections 130, the first slit 141, the second slit 142, and the outer peripheral slit 143.

Here, the axial direction of the polarization axis of the single crystal piezoelectric material of the piezoelectric layer 11 will be described. It is preferable that an axial direction of a virtual axis when the polarization axis of the single crystal piezoelectric material is projected from the laminating direction onto a virtual plane orthogonal or substantially orthogonal to the laminating direction extend in the same direction in all of the plurality of beam sections 120, and an angle between the axial direction of the virtual axis and an extending direction of each of the first slit 141 and the second slit 142 is not about 45 degrees or about 135 degrees when viewed from the laminating direction. More specifically, in the present preferred embodiment, it is more preferable that the angle between the axial direction of the virtual axis and the extending direction of each of the first slit 141 and the second slit 142 is, for example, about 0 degrees or more and about 5 degrees or less, about 85 degrees or more and about 95 degrees or less, or about 175 degrees or more and less than about 180 degrees when viewed from the laminating direction. In addition, it is more preferable that the angle between the extension direction of each of the plurality of beam sections 120 when viewed from the laminating direction and the axial direction of the virtual axis when viewed from the laminating direction is, for example, about 40 degrees or more and about 50 degrees or less, or about 130 degrees or more and about 140 degrees or less. It is preferable that the axial direction of the virtual axis in the piezoelectric device 100 according to the present preferred embodiment satisfy the above relationships for all of the first slits 141, the second slits 142, and the bridging portions 131. The reason for having a suitable range for each angle involved in the virtual axis will be described later.

In the present preferred embodiment, the axial direction of the virtual axis is oriented in a specific direction, but the axial direction of the virtual axis is not limited to a specific direction.

In addition, in the present preferred embodiment, since the single crystal piezoelectric material has the polarization axis, thermal stress generated in the plurality of beam sections 120 may cause each of the plurality of beam sections 120 to warp when viewed from the direction orthogonal or substantially orthogonal to the laminating direction. Modifications in which each of the plurality of beam sections 120 is warped will be described below.

Figure 5:
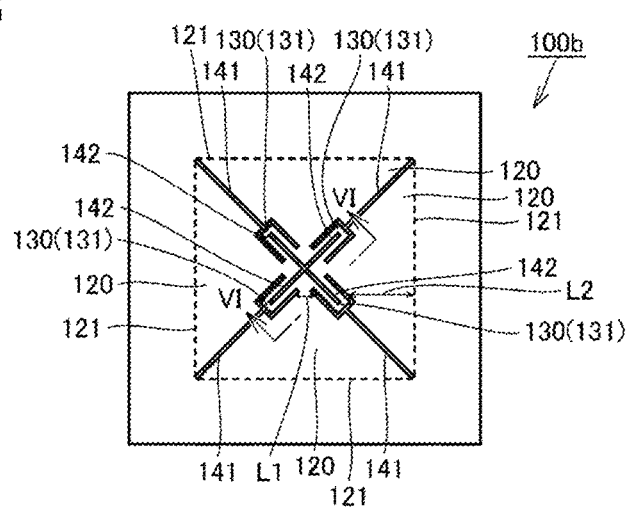
FIG. 5 is a plan view of a piezoelectric device according to a second modification of Preferred Embodiment 1 of the present invention.
Figure 6:
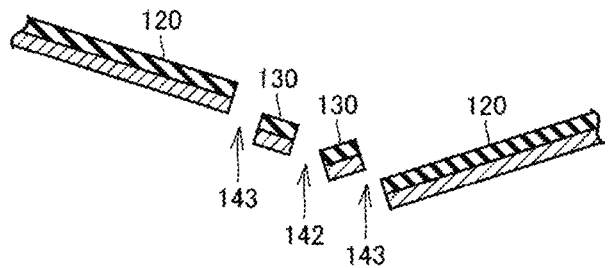
FIG. 6 is a partial sectional view of the piezoelectric device illustrated in FIG. 5 taken along line VI-VI.

FIG. 5 is a plan view of a piezoelectric device according to a second modification of Preferred Embodiment 1 of the present invention. FIG. 6 is a partial sectional view of the piezoelectric device illustrated in FIG. 5 taken along line VI-VI.

As illustrated in FIG. 5, in a piezoelectric device 100b according to the second modification of Preferred Embodiment 1 of the present invention, the angle between the axial direction of the virtual axis and each of the plurality of first slits 141 and the plurality of second slits 142 is, for example, about 45 degrees when viewed from the laminating direction.

Thus, in the second modification, a distance L1 from the center of the connecting section 130 to an opposite end portion of one beam section 120 of the pair of beam sections 120 and a distance L2 from the center of the connecting section 130 to an opposite end portion of another beam section 120 of the pair of beam sections 120 in the axial direction of the virtual axis when viewed from the laminating direction are different from each other. In addition, the end portion of the one beam section 120 of the pair of beam sections 120 located on the side opposite to the side of the center of the connecting section 130 in the axial direction of the virtual axis when viewed from the laminating direction is not the fixed end portion 121. On the other hand, the end portion of the other beam section 120 located on the side opposite to the side of the center of the connecting section 130 in the axial direction of the virtual axis when viewed from the laminating direction is the fixed end portion 121. Thus, when thermal stress is applied to the plurality of beam sections 120, the pair of beam sections 120 warp in different modes in the vicinity of the connecting section 130.

In the piezoelectric device 100b according to the second modification, the above-described thermal stress is applied to the plurality of beam sections 120. As a result, as illustrated in FIG. 6, when the piezoelectric device 100b is not driven, end portions of the pair of beam sections 120 in the vicinity of the center of the connecting section 130 are located at positions different from each other in the laminating direction.

Figure 7:
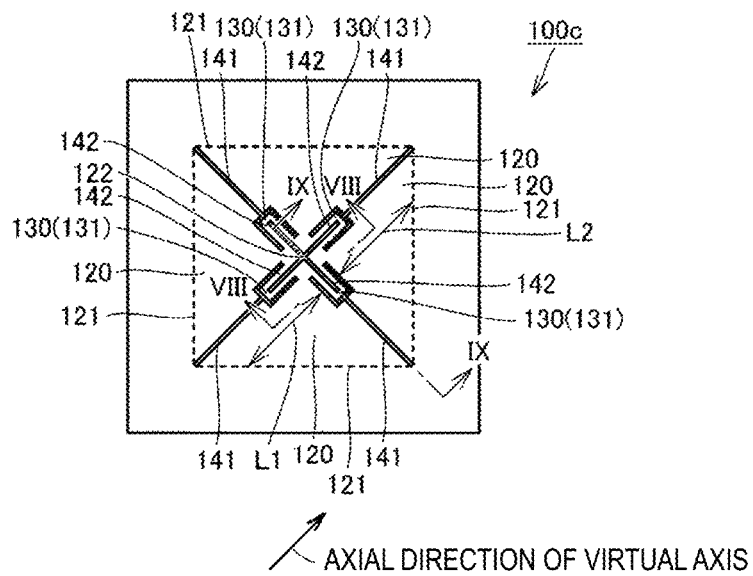
FIG. 7 is a plan view of a piezoelectric device according to a third modification of Preferred Embodiment 1 of the present invention.
Figure 8:
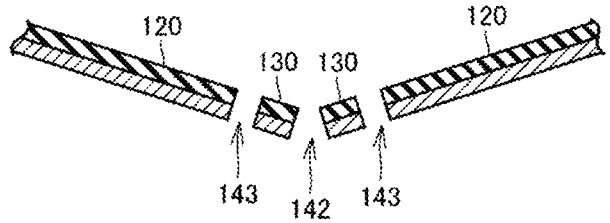
FIG. 8 is a partial sectional view of the piezoelectric device illustrated in FIG. 7 taken along line VIII-VIII.
Figure 9:
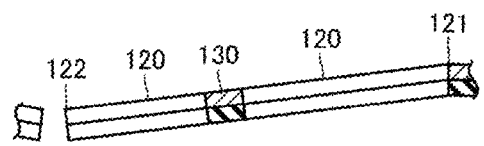
FIG. 9 is a partial sectional view of the piezoelectric device illustrated in FIG. 7 taken along line IX-IX.

FIG. 7 is a plan view of a piezoelectric device according to a third modification of Preferred Embodiment 1 of the present invention. FIG. 8 is a partial sectional view of the piezoelectric device illustrated in FIG. 7 taken along line VIII-VIII. FIG. 9 is a partial sectional view of the piezoelectric device illustrated in FIG. 7 taken along line IX-IX.

As illustrated in FIG. 7, in a piezoelectric device 100c according to the third modification of Preferred Embodiment 1 of the present invention, the angle between the axial direction of the virtual axis of the single crystal piezoelectric material and each of the plurality of first slits 141 and the plurality of second slits 142 is, for example, about 0 degrees or about 90 degrees when viewed from the laminating direction.

Thus, in the third modification, a distance L1 from the center of the connecting section 130 to an opposite end portion of one beam section 120 of the pair of beam sections 120 and a distance L2 from the center of the connecting section 130 to an opposite end portion of another beam section 120 of the pair of beam sections 120 in the axial direction of the virtual axis when viewed from the laminating direction are equal or substantially equal to each other. In addition, in the axial direction of the virtual axis when viewed from the laminating direction, a distance from an end portion in the vicinity of the center of the connecting section 130 to the fixed end portion 121 in the one beam section 120 of the pair of beam sections 120 is equal or substantially equal to a distance from an end portion in the vicinity of the center of the connecting section 130 to the fixed end portion 121 in the other beam section 120.

Further, in the piezoelectric device 100c according to the third modification, each of the plurality of beam sections 120 is warped due to thermal stress applied to the plurality of beam sections 120. As a result, as illustrated in FIG. 8, when the piezoelectric device 100c is not driven, the end portions of the pair of beam sections 120 in the vicinity of the center of the connecting section 130 on the side of the center of the connecting section 130 are located at the same or substantially the same position in the laminating direction. As described above, in the third modification, even when each of the plurality of beam sections 120 is warped due to thermal stress, it is possible to reduce or prevent damage at the connecting section 130, particularly, the bridging portion 131.

As described above, by comparing the piezoelectric device 100b according to the second modification with the piezoelectric device 100c according to the third modification of Preferred Embodiment 1 of the present invention, the following can be seen. In Preferred Embodiment 1 of the present invention, when viewed from the laminating direction, the closer the angle between the axial direction of the virtual axis and the extending direction of each of the first slit 141 and the second slit 142 approaches about 0 degrees or about 90 degrees, compared to about 45 degrees or about 135 degrees, the more the difference in displacement of the pair of beam sections 120 due to thermal stress can be suppressed. Similarly, in Preferred Embodiment 1 of the present invention, it can be seen that the closer the angle between the axial direction of the virtual axis and the extension direction of each of the plurality of beam sections 120 when viewed from the laminating direction approaches about 45 degrees or about 135 degrees, compared to about 0 degrees or about 90 degrees, the more the difference in displacement of the pair of beam sections 120 due to thermal stress can be suppressed.

As illustrated in FIG. 9, in the piezoelectric device 100c according to the third modification of Preferred Embodiment 1 of the present invention, when both of the pair of beam sections 120 are viewed from the first slit 141 side and the second slit 142 side, both of the pair of beam sections 120 are inclined toward one side in the laminating direction.

In the piezoelectric device 100 according to Preferred Embodiment 1 of the present invention, each of the plurality of beam sections 120 is configured to be capable of flexural vibration. Here, the mechanism of the flexural vibration of the plurality of beam sections 120 will be described.

Figure 10:
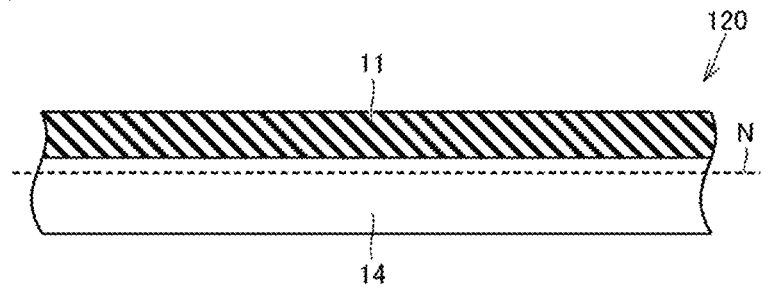
FIG. 10 is a sectional view schematically illustrating a portion of a beam section of the piezoelectric device according to Preferred Embodiment 1 of the present invention.
Figure 11:
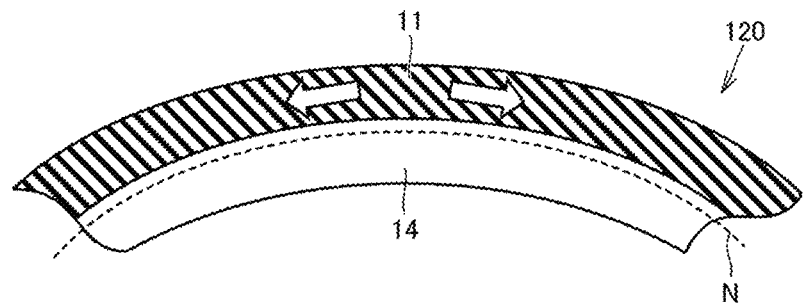
FIG. 11 is a sectional view schematically illustrating a portion of the beam section of the piezoelectric device according to Preferred Embodiment 1 of the present invention during driving.

FIG. 10 is a sectional view schematically illustrating a portion of the beam section of the piezoelectric device according to Preferred Embodiment 1 of the present invention. FIG. 11 is a sectional view schematically illustrating a portion of the beam section of the piezoelectric device according to Preferred Embodiment 1 of the present invention during driving. In FIGS. 10 and 11, the first electrode layer and the second electrode layer are not illustrated.

As illustrated in FIGS. 10 and 11, in the present preferred embodiment, in the plurality of beam sections 120, the piezoelectric layer 11 defines and functions as an elastic layer that is stretchable in an in-plane direction orthogonal or substantially orthogonal to the laminating direction, and the layers other than the piezoelectric layer 11 define and function as a constraining layer. In the present preferred embodiment, the support layer 14 defines and functions as a main a portion of the constraining layer. In this manner, the constraining layer is laminated on the elastic layer in a direction orthogonal or substantially orthogonal to an extending/contracting direction of the elastic layer. Note that each of the plurality of beam sections 120 may include, instead of the constraining layer, a reverse-direction elastic layer that can contract in the in-plane direction when the elastic layer expands in the in-plane direction and can expand in the in-plane direction when the elastic layer contracts in the in-plane direction.

When the piezoelectric layer 11, which is the elastic layer, expands and contracts in the in-plane direction, the support layer 14, which is the main portion of the constraining layer, constrains the expansion and contraction of the piezoelectric layer 11 at the bonding surface with the piezoelectric layer 11. In addition, in the present preferred embodiment, in each of the plurality of beam sections 120, the piezoelectric layer 11, which is the elastic layer, is located only on one side of a stress neutral plane N of each of the plurality of beam sections 120. The position of the center of gravity of the support layer 14, which is the main portion of the constraining layer, is located on another side of the stress neutral plane N. As a result, as illustrated in FIGS. 10 and 11, when the piezoelectric layer 11, which is the elastic layer, expands and contracts in the in-plane direction, each of the plurality of beam sections 120 bends in a direction orthogonal or substantially orthogonal to the in-plane direction. The longer the separation distance between the stress neutral plane N and the piezoelectric layer 11, the larger the amount of displacement of each of the plurality of beam sections 120 when each of the plurality of beam sections 120 bends. In addition, the larger the stress for expanding and contracting the piezoelectric layer 11, the larger the amount of the displacement. In this manner, each of the plurality of beam sections 120 flexuously vibrates with the fixed end portion 121 as a starting point in the direction orthogonal or substantially orthogonal to the in-plane direction.

Further, in the piezoelectric device 100 according to the present preferred embodiment, by providing the connecting section 130, vibration in the fundamental mode of vibration is easily generated, and generation of vibration in the coupled vibration mode is reduced or prevented. The fundamental mode of vibration is a mode in which the phases of flexural vibrations of the plurality of beam sections 120 are synchronized, and the all or substantially the all of the plurality of beam sections 120 are simultaneously displaced to either upward or downward. On the other hand, the coupled vibration mode is a mode in which the phase of at least one of the plurality of beam sections 120 is not synchronized with the phase of the other beam sections 120 when the plurality of beam sections 120 each flexuously vibrates.

Figure 12:
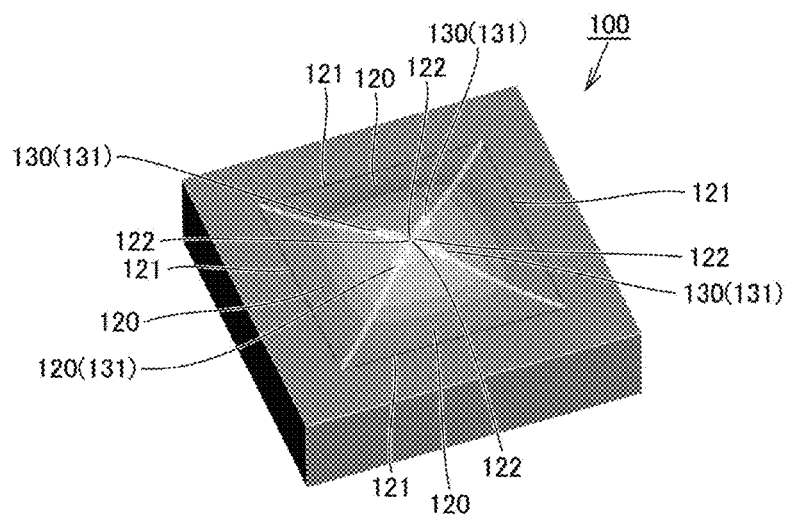
FIG. 12 is a perspective view illustrating a state in which the piezoelectric device according to Preferred Embodiment of the present invention vibrates in a fundamental mode of vibration by simulation.

FIG. 12 is a perspective view illustrating a state in which the piezoelectric device according to Preferred Embodiment 1 of the present invention vibrates in the fundamental mode of vibration by simulation. Specifically, FIG. 12 illustrates the piezoelectric device 100 in which each of the plurality of beam sections 120 is displaced to the side of the first electrode layer 12. Further, in FIG. 12, the larger the amount of displacement of each of the plurality of beam sections 120 displaced to the side of the first electrode layer 12, the lighter the color of each of the plurality of beam sections 120. In FIG. 12, the layers defining the plurality of layers 10 are not illustrated.

As illustrated in FIG. 12, for each of the plurality of beam sections 120, the pair of beam sections 120 adjacent to each other are connected to each other by the connecting section 130, so that the generation of the coupled vibration mode is reduced or prevented.

Further, in the connecting section 130 of the piezoelectric device 100 according to the present preferred embodiment, the first end portion 133A and the second end portion 133B are each located closer to the tip end portions 122 than to the fixed end portions 121 of the pair of beam sections 120. This allows the plurality of beam sections 120 to be connected relatively strongly to each other, so that the phases of the vibrations of the plurality of beam sections 120 are more easily synchronized. In addition, the connecting section 130 of the piezoelectric device 100 according to the present preferred embodiment includes the bridging portion 131. The bridging portion 131 connects the pair of beam sections 120 while turning back between the pair of beam sections 120. Thus, when the plurality of beam sections 120 vibrate, the first coupling section 132A and the second coupling section 132B define and function as a plate spring, and the length of the connecting section 130 as the plate spring becomes longer by connecting the first coupling portion 132A and the second coupling portion 132B in series with the bridging portion 131 interposed therebetween while the connecting section 130 connects the pair of beam sections 120 to each other. This reduces or prevents the excessive connecting force by the connecting section 130.

The piezoelectric device 100 according to the present preferred embodiment has improved device characteristics, particularly when the piezoelectric device 100 is used as an ultrasonic transducer, because vibration in the fundamental mode of vibration is easily generated and generation of the coupled vibration mode is reduced or prevented. Hereinafter, a functional operation of the piezoelectric device 100 when the piezoelectric device 100 according to the present preferred embodiment is used as an ultrasonic transducer will be described.

First, as illustrated in FIG. 2, when generating ultrasonic waves with the piezoelectric device 100, a voltage is applied between the first connection electrode layer 20 and the second connection electrode layer 30. Then, a voltage is applied between the first electrode layer 12 connected to the first connection electrode layer 20 and the second electrode layer 13 connected to the second connection electrode layer 30. Further, in each of the plurality of beam sections 120, a voltage is applied between the first electrode layer 12 and the second electrode layer 13, which face each other with the piezoelectric layer 11 in between. Then, since the piezoelectric layer 11 expands and contracts along the in-plane direction orthogonal or substantially orthogonal to the laminating direction, each of the plurality of beam sections 120 flexuously vibrates along the laminating direction according to the above-described mechanism. This applies a force to the medium around the plurality of beam sections 120 of the piezoelectric device 100, and the medium vibrates, thereby generating ultrasonic waves.

In the piezoelectric device 100 according to the present preferred embodiment, each of the plurality of beam sections 120 has a unique mechanical resonant frequency. Thus, when the applied voltage is a sinusoidal voltage and the frequency of the sinusoidal voltage is close to the value of the resonant frequency, the amount of displacement when each of the plurality of beam sections 120 is bent increases.

When detecting ultrasonic waves by the piezoelectric device 100, the medium around each of the plurality of beam sections 120 vibrates due to the ultrasonic waves, a force is applied to each of the plurality of beam sections 120 from the medium around each of the plurality of beam sections 120, and each of the plurality of beam sections 120 flexuously vibrates. When each of the plurality of beam sections 120 flexuously vibrates, stress is applied to the piezoelectric layer 11. When stress is applied to the piezoelectric layer 11, an electric charge is induced in the piezoelectric layer 11. The electric charge induced in the piezoelectric layer 11 generates a potential difference between the first electrode layer 12 and the second electrode layer 13, which face each other with the piezoelectric layer 11 in between. This potential difference is detected by the first connection electrode layer 20 connected to the first electrode layer 12 and the second connection electrode layer 30 connected to the second electrode layer 13. Thus, the piezoelectric device 100 can detect ultrasonic waves.

In addition, when the ultrasonic wave to be detected includes a large number of specific frequency components and these frequency components are close to the value of the resonant frequency, the amount of displacement when each of the plurality of beam sections 120 flexuously vibrates increases. As the amount of displacement increases, the potential difference increases.

As described above, when the piezoelectric device 100 according to the present preferred embodiment is used as an ultrasonic transducer, the design of the resonant frequencies of the plurality of beam sections 120 is important. The resonant frequency varies depending on the length of each of the plurality of beam sections 120 in the extending direction, the thickness of each of the plurality of beam sections 120 in the axial direction of the central axis, the length of the fixed end portion 121 when viewed from the axial direction, and the densities and elastic moduli of the materials of the plurality of beam sections 120. It is preferable that the plurality of beam sections have the same or substantially the same resonant frequency as each other. For example, when the thicknesses of the plurality of beam sections 120 are different from each other, the lengths of the plurality of beam sections 120 in the extending direction are adjusted so that the plurality of beam sections 120 has the same or substantially the same resonant frequency as each other.

In the piezoelectric device 100 according to Preferred Embodiment 1 of the present invention illustrated in FIGS. 1 to 3, when the resonant frequency of each of the plurality of beam sections 120 is designed to be in the vicinity of about 40 kHz, for each of the plurality of beam sections 120, for example, the piezoelectric layer 11 is made of lithium niobate, the thickness of the piezoelectric layer 11 is about 1 μm, the thickness of each of the first electrode layer 12 and the second electrode layer 13 is about 0.1 μm, the thickness of the first support portion 14*a* is about 0.8 μm, the thickness of the second support portion 14*b* is about 1.4 μm, the shortest distance from the fixed end portion 121 to the tip end portion 122 of each of the plurality of beam sections 120 is about 400 μm, and the length of the fixed end portion 121 is about 800 μm when viewed from the laminating direction.

The piezoelectric device 100 according to the present preferred embodiment includes the connecting section 130 having the above-described configuration, thus facilitating the generation of vibration in the fundamental mode of vibration and reducing or preventing the generation of the coupled vibration mode. Thus, in a case in which the piezoelectric device 100 is used as an ultrasonic transducer, it is reduced or prevented that the phases of the vibrations of the plurality of beam sections 120 are different from each other when also detecting ultrasonic waves having the same or substantially the same frequency component as the resonant frequency. Further, the cancellation of electric charges generated in the piezoelectric layers 11 of the plurality of beam sections 120 in the first electrode layer 12 or the second electrode layer 13 due to the different phases of the vibrations of the plurality of beam sections 120 is reduced or prevented.

Thus, in the piezoelectric device 100, the device characteristics as an ultrasonic transducer are improved.

Figure 13:
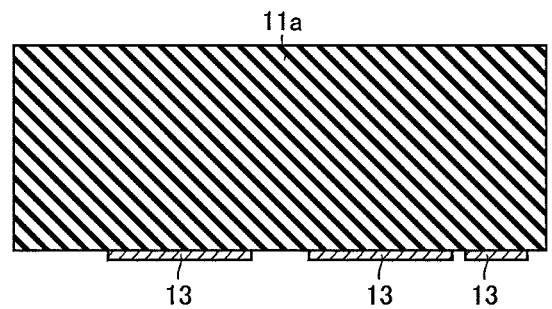
FIG. 13 is a sectional view illustrating a state in which a second electrode layer is provided on a piezoelectric single crystal substrate in a method for manufacturing a piezoelectric device according to Preferred Embodiment 1 of the present invention.

Hereinafter, a non-limiting example of a method for manufacturing the piezoelectric device 100 according to Preferred Embodiment 1 of the present invention will be described. FIG. 13 is a sectional view illustrating a state in which a second electrode layer is provided on a piezoelectric single crystal substrate in the method for manufacturing a piezoelectric device according to Preferred Embodiment 1 of the present invention. In FIG. 13 and FIGS. 14 to 19 illustrated below, the sectional views similar to that of FIG. 2 are illustrated.

As illustrated in FIG. 13, first, an adhesion layer (not illustrated) is provided on the lower surface of a piezoelectric single crystal substrate 11*a*, and then the second electrode layer 13 is provided on the side of the adhesion layer opposite to the piezoelectric single crystal substrate 11*a* side. The second electrode layer 13 is configured to have a desired pattern by deposition and lift-off, for example. The second electrode layer 13 may be formed by, for example, laminating a layer over the entire or substantially the entire lower surface of the piezoelectric single crystal substrate 11*a* by sputtering and then forming a desired pattern by etching. The second electrode layer 13 and the adhesion layer may be epitaxially grown.

Figure 14:
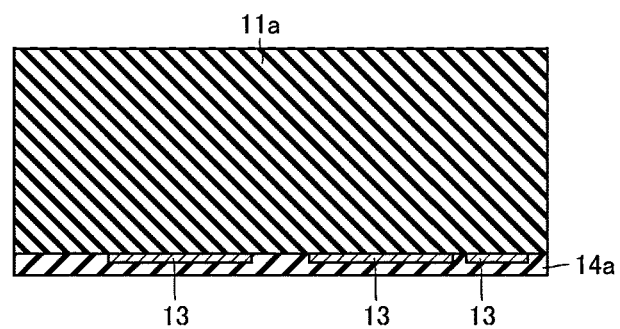
FIG. 14 is a sectional view illustrating a state in which a first support portion is provided in a method for manufacturing the piezoelectric device according to Preferred Embodiment 1 of the present invention.

FIG. 14 is a sectional view illustrating a state in which a first support portion is provided in the method for manufacturing the piezoelectric device according to Preferred Embodiment 1 of the present invention. As illustrated in FIG. 14, the first support portion 14*a* is provided on each of the lower surfaces of the piezoelectric single crystal substrate 11*a* and the second electrode layer 13 by, for example, chemical vapor deposition (CVD), physical vapor deposition (PVD), or the like. Immediately after the first support portion 14*a* is provided, a portion of the lower surface of the first support portion 14*a* located on the side of the first support portion 14*a* opposite to the second electrode layer 13 side is raised. Thus, the lower surface of the first support portion 14*a* is ground and planarized by, for example, chemical mechanical polishing (CMP) or the like.

Figure 15:
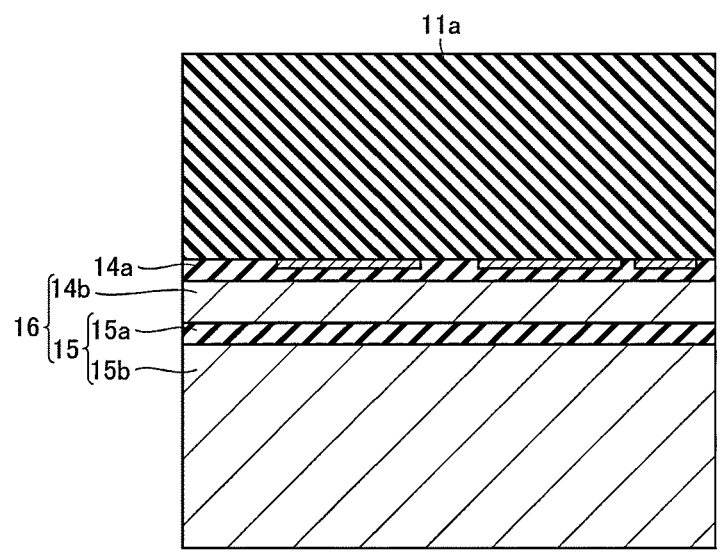
FIG. 15 is a sectional view illustrating a state in which a multilayer body is bonded to the first support portion in a method for manufacturing the piezoelectric device according to Preferred Embodiment 1 of the present invention.

FIG. 15 is a sectional view illustrating a state in which a multilayer body is bonded to the first support portion in the method for manufacturing the piezoelectric device according to Preferred Embodiment 1 of the present invention. As illustrated in FIG. 15, a multilayer body 16 including the second support portion 14*b* and the substrate layer 15 is bonded to the lower surface of the first support portion 14*a* by, for example, surface activated bonding or atomic diffusion bonding. In the present preferred embodiment, the multilayer body 16 is, for example, a silicon on insulator (SOI) substrate. Note that the yield of the piezoelectric devices 100 is improved by planarizing the upper surface of the second support portion 14*b* in advance by, for example, CMP or the like.

Figure 16:
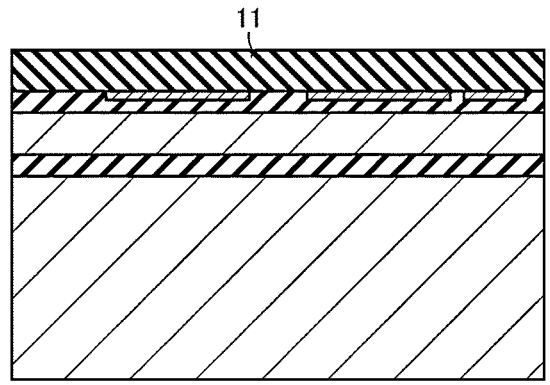
FIG. 16 is a sectional view illustrating a state in which a piezoelectric layer is formed by grinding the piezoelectric single crystal substrate in a method for manufacturing the piezoelectric device according to Preferred Embodiment 1 of the present invention.

FIG. 16 is a sectional view illustrating a state in which a piezoelectric layer is formed by grinding/polishing the piezoelectric single crystal substrate in the method for manufacturing the piezoelectric device according to Preferred Embodiment 1 of the present invention. As illustrated in FIGS. 15 and 16, the piezoelectric single crystal substrate 11*a* is thinned by grinding the upper surface with a grinder. By further polishing the upper surface of the thinned piezoelectric single crystal substrate 11*a* by, for example, CMP or the like, the piezoelectric single crystal substrate 11*a* is formed into the piezoelectric layer 11.

The piezoelectric single crystal substrate 11*a* may be formed into the piezoelectric layer 11 by, for example, injecting ions into the upper surface side of the piezoelectric single crystal substrate 11*a* in advance to form an exfoliation layer and separating the exfoliation layer. In addition, the upper surface of the piezoelectric single crystal substrate 11*a* after the exfoliation layer is separated may be further polished by, for example, CMP or the like to form the piezoelectric single crystal substrate 11a into the piezoelectric layer 11.

Figure 17:
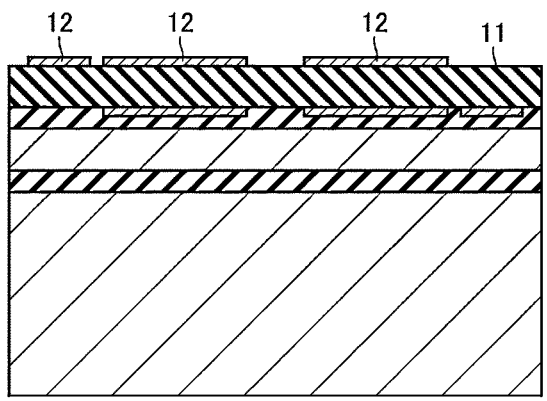
FIG. 17 is a sectional view illustrating a state in which a first electrode layer is provided on the piezoelectric layer in a method for manufacturing the piezoelectric device according to Preferred Embodiment 1 of the present invention.

FIG. 17 is a sectional view illustrating a state in which a first electrode layer is provided on the piezoelectric layer in the method for manufacturing the piezoelectric device according to Preferred Embodiment 1 of the present invention. As illustrated in FIG. 17, after an adhesion layer (not illustrated) is provided on the upper surface of the piezoelectric layer 11, the first electrode layer 12 is provided on the side of the adhesion layer opposite to the piezoelectric layer 11 side. The first electrode layer 12 is formed to have a desired pattern by, for example, deposition and lift-off. The first electrode layer 12 may be formed by, for example, laminating a layer over the entire upper surface of the piezoelectric layer 11 by sputtering and then forming a desired pattern by etching. The first electrode layer 12 and the adhesion layer may be epitaxially grown.

Figure 18:
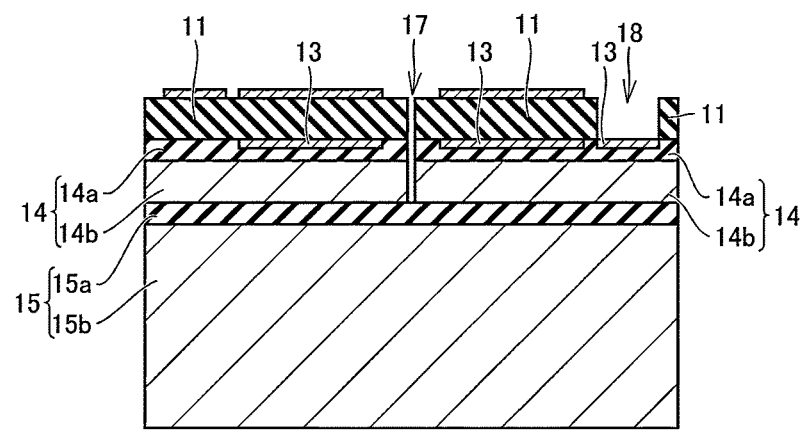
FIG. 18 is a sectional view illustrating a state in which a groove and a recess are provided in a method for manufacturing the piezoelectric device according to Preferred Embodiment 1 of the present invention.

FIG. 18 is a sectional view illustrating a state in which a groove and a recess are provided in the method for manufacturing the piezoelectric device according to Preferred Embodiment 1 of the present invention. As illustrated in FIG. 18, a slit is formed in the piezoelectric layer 11 and the first support portion 14a by, for example, dry etching with reactive ion etching (RIE) or the like in a region corresponding to a region inside the base 110 of the piezoelectric device 100 when viewed from the laminating direction. The slit may be formed by, for example, wet etching with nitrohydrofluoric acid or the like. Further, the second support portion 14b exposed to the slit is etched by, for example, deep reactive ion etching (DRIE) so that the slit reaches the upper surface of the substrate layer 15. This forms a groove 17 illustrated in FIG. 18 corresponding to the first slit 141, the second slit 142, and the outer peripheral slit 143 in the piezoelectric device 100 illustrated in FIGS. 1 and 2.

Further, as illustrated in FIG. 18, in the portion corresponding to the base 110 of the piezoelectric device 100, the piezoelectric layer 11 is etched by, for example, the dry etching or the wet etching so that a portion of the second electrode layer 13 is exposed. Thus, a recess 18 is formed.

Figure 19:
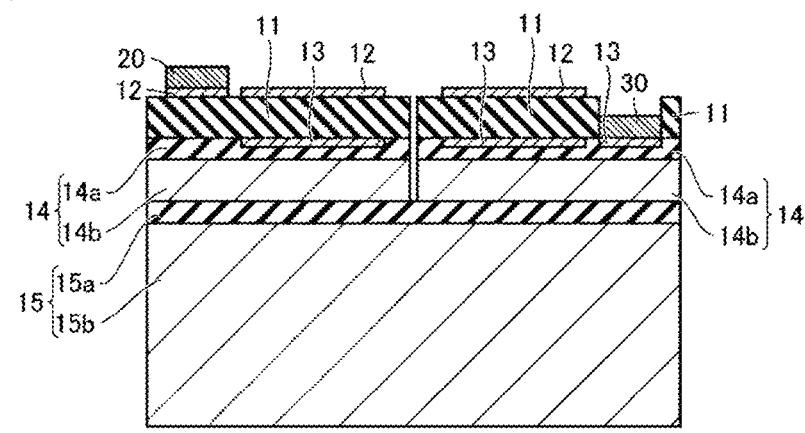
FIG. 19 is a sectional view illustrating a state in which a first connection electrode layer and a second connection electrode layer are provided in a method for manufacturing the piezoelectric device according to Preferred Embodiment 1 of the present invention.

FIG. 19 is a partial sectional view illustrating a state in which a first connection electrode layer and a second connection electrode layer are provided in the method for manufacturing the piezoelectric device according to Preferred Embodiment 1 of the present invention. Then, as illustrated in FIG. 19, in the portion corresponding to the base 110, an adhesion layer (not illustrated) is provided on each of the first electrode layer 12 and the second electrode layer 13, and then the first connection electrode layer 20 and the second connection electrode layer 30 are provided on the upper surfaces of the adhesion layers, respectively, by, for example, deposition and lift-off. The first connection electrode layer 20 and the second connection electrode layer 30 may be formed by, for example, laminating a layer over the entire or substantially the entire surfaces of the piezoelectric layer 11, the first electrode layer 12, and the exposed second electrode layer 13 by sputtering and then forming a desired pattern by etching.

Then, as illustrated in FIGS. 19 and 2, finally, of the substrate layer 15, a portion of the second substrate layer 15b is removed by, for example, DRIE, and then a portion of the first substrate layer 15a is removed by, for example, RIE. This forms the cavity 101, as well as the plurality of beam sections 120 and the connecting sections 130.

Through the above-described steps, the piezoelectric device 100 according to Preferred Embodiment 1 of the present invention as illustrated in FIGS. 1 to 3 is manufactured.

As described above, the piezoelectric device 100 according to Preferred Embodiment 1 of the present invention includes the base 110, the plurality of beam sections 120, and the plurality of connecting sections 130. Each of the plurality of beam sections 120 includes the fixed end portion 121 and the tip end portion 122. The fixed end portion 121 is connected to the base 110. The tip end portion 122 is located on the side opposite to the fixed end portion 121. Each of the plurality of beam sections 120 extends from the fixed end portion 121 toward the tip end portion 122. Each of the plurality of beam sections 120 is a piezoelectric vibrating section including the plurality of layers 10. The connecting section 130 connects the pair of beam sections 120 adjacent to each other among the plurality of beam sections 120. The first slit 141 and the second slit 142 are provided between the pair of beam sections 120. The first slit 141 is defined by portions of the end edges adjacent to each other of the pair of beam sections 120. The second slit 142 is defined by other portions of the end edges adjacent to each other of the pair of beam sections 120 at the position different from that of the first slit 141. The connecting section 130 is located at least between the first slit 141 and the second slit 142. The connecting section 130 includes the first end portion 133A, the second end portion 133B, the bridging portion 131, the first coupling portion 132A, and the second coupling portion 132B. The connecting section 130 is connected to the one of the pair of beam sections 120 at the first end portion 133A. The connecting section 130 is connected to the other of the pair of beam sections 120 at the second end portion 133B. The second end portion 133B faces the first end portion 133A in the direction in which the pair of beam sections 120 are aligned. The bridging portion 131 connects the pair of beam sections 120 while turning back between the pair of beam sections 120. The first coupling portion 132A is connected to the portion of the bridging portion 131 located on the side of the one of the pair of beam sections 120. The second coupling portion 132B is connected to the portion of the bridging portion 131 located on the side of the other of the pair of beam sections 120. The second coupling portion 132B is located along the first coupling portion 132A. The connecting section 130 includes only one first end portion 133A. The connecting section 130 includes only one second end portion 133B. Each of the first end portion 133A and the second end portion 133B is located closer to the tip end portion 122 than to the fixed end portion 121 of each of the pair of beam sections 120.

This allows vibration variation of each of the plurality of beam sections 120 to be reduced or prevented while reducing or preventing an increase in the resonant frequency of each of the plurality of beam sections 120 during vibration.

In the present preferred embodiment, the outer peripheral slit 143 is provided between the pair of beam sections 120 by the end edge on the outer peripheral side of the turn of the connecting section 130 at the bridging portion 131 and the end edges of the pair of beam sections 120. The first slit 141 is connected to the outer peripheral slit 143. The second slit 142 is located on the inner peripheral side of the turn of the connecting section 130 at the bridging portion 131.

This facilitates the formation of the bridging portion 131 and reduces or prevents the interference by the pair of beam sections 120 with the operation of the connecting section 130, particularly the bridging portion 131 when the plurality of beam sections 120 vibrates.

In the present preferred embodiment, the first coupling portion 132A extends, along the second slit 142, starting from the first end portion 133A, and the second coupling portion 132B extends, along the second slit 142, starting from the second end portion 133B.

This makes it easy to form the first coupling portion 132A and the second coupling portion 132B by forming the second slit 142.

In the present preferred embodiment, the first coupling portion 132A is directly connected to the bridging portion 131 on the side opposite to the first end portion 133A side. The second coupling portion 132B is directly connected to the bridging portion 131 on the side opposite to the second end portion 133B side.

This allows the connecting section 130 to be turned once, and the connecting section 130 can be configured with the minimum number of necessary portions.

In the present preferred embodiment, when viewed from the laminating direction of the plurality of layers 10, the dimensions of the extension lengths L of the first coupling portion 132A and the second coupling portion 132B are larger than the dimensions of the minimum widths W of the first coupling portion 132A and the second coupling portion 132B in the direction orthogonal or substantially orthogonal to the direction along the paths in which the first coupling portion 132A and the second coupling portion 132B extend toward the connection locations with the bridging portion 131.

This reduces or prevents the excessive connecting force by the connecting section 130 when the plurality of beam sections 120 vibrates.

In the present preferred embodiment, when viewed from the laminating direction of the plurality of layers 10, the dimensions of the extension lengths L of the first coupling portion 132A and the second coupling portion 132B, which are the lengths of the paths along which the first coupling portion 132A and the second coupling portion 132B extend toward the connection locations with the bridging portion 131, are larger than the dimensions of the shortest lengths b from the connecting section 130 to the tip end portions 122.

This allows the force to connect the pair of beam sections 120 by the connecting section 130 to be stronger by making the shortest lengths b relatively small, and reduces or prevents the excessive connecting force by the connecting section 130 by increasing the dimensions of the extension lengths L.

In the present preferred embodiment, when viewed from the laminating direction of the plurality of layers 10, the dimensions of the extension lengths L of the first coupling portion 132A and the second coupling portion 132B, which are the lengths of the paths along which the first coupling portion 132A and the second coupling portion 132B extend toward the connection locations with the bridging portions 131, are larger than the dimension of the maximum width a of the bridging portion 131 in the direction orthogonal or substantially orthogonal to the direction in which the pair of beam sections 120 face each other.

This makes the maximum width a of the bridging portion 131 in the connecting section 130 relatively small. That is, the weight of the bridging portion 131 in the connecting section 130 becomes relatively small. This reduces or prevents deterioration of the device characteristics of the piezoelectric device 100 due to undesired vibration of the bridging portion 131.

In the present preferred embodiment, when viewed from the laminating direction of the plurality of layers 10, the dimension of the maximum width a of the bridging portion 131 in the direction orthogonal or substantially orthogonal to the direction in which the pair of beam sections 120 face each other is larger than the dimensions of the minimum widths W of the first coupling portion 132A and the second coupling portion 132B in the direction orthogonal or substantially orthogonal to the direction along the paths in which the first coupling portion 132A and the second coupling portion 132B extend toward the connection locations with the bridging portion 131.

This allows the first coupling portion 132A, the second coupling portion 132B, and the bridging portion 131 to be integrated as one piece, and the connecting section 130 to define and function like the single plate spring when the plurality of beam sections 120 vibrates. Thus, the excessive connecting force by the connecting section 130 can be further reduced or prevented.

In the present preferred embodiment, the first slit 141 is located on the fixed end portion 121 side of each of the pair of beam sections 120 with respect to the bridging portion 131. The second slit 142 is located on the tip end portion 122 side of each of the pair of beam sections 120 with respect to the bridging portion 131.

This further reduces or prevents the excessive force to connect the pair of beam sections 120 by the connecting section 130 because the connecting section 130 does not directly connect the tip end portions 122 of the pair of beam sections 120 to each other. Further, since the first slit 141 is connected to the outer peripheral slit 143 and the second slit 142 is located on the inner peripheral side of the turn of the connecting section 130 at the bridging portion 131, the first end portion 133A and the second end portion 133B are located closer to the tip end portions 122, so that vibration variation of the pair of beam sections 120 can be further reduced or prevented.

The piezoelectric device 100 according to Preferred Embodiment 1 of the present invention includes four beam sections 120 as the plurality of beam sections 120 and four connecting sections 130 as the plurality of connecting sections 130. The four beam sections 120 are each located along the same or substantially the same plane. The four beam sections 120 each extend toward the virtual center point and are adjacent to each other in the circumferential direction around the virtual center point. Each of the four connecting sections 130 is located between the beam sections 120 adjacent to each other among the four beam sections 120 and connects the pair of beam sections 120 adjacent to each other.

Thus, in the piezoelectric device 100 including the four beam sections 120, the connecting section 130 can reduce or prevent the vibration variation of the four beam sections 120 while reducing or preventing an increase in the resonant frequency of each of the four beam sections 120 during vibration.

In the present preferred embodiment, the plurality of layers 10 includes the piezoelectric layer 11, the first electrode layer 12, and the second electrode layer 13. The piezoelectric layer 11 is made of a single crystal piezoelectric material. The first electrode layer 12 is disposed on the one side of the piezoelectric layer 11 in the laminating direction of the plurality of layers 10. The second electrode layer 13 is disposed on the other side of the piezoelectric layer 11 so as to face at least part of the first electrode layer 12 with the piezoelectric layer 11 in between. The axial direction of the virtual axis when the polarization axis of the single crystal piezoelectric material is projected from the laminating direction onto the virtual plane orthogonal or substantially orthogonal to the laminating direction extends in the same or substantially the same direction in all of the plurality of beam sections 120, and the angle between the axial direction of the virtual axis and the extending direction of each of the first slit 141 and the second slit 142 is not about 45 degrees when viewed from the laminating direction.

This enables the piezoelectric device 100 in which the piezoelectric layer 11 is made of a single crystal piezoelectric material having a polarization axis to reduce deviation of stress distribution generated in the connecting section 130 and to reduce or prevent damage of the connecting section 130 even when thermal stress is generated in each of the pair of beam sections 120.

In the present preferred embodiment, when viewed from the laminating direction, the angle between the axial direction of the virtual axis and the extending direction of each of the first slit 141 and the second slit 142 is, for example, about 0 degrees or more and about 5 degrees or less, about 85 degrees or more and about 95 degrees or less, or about 175 degrees or more and less than about 180 degrees.

This further reduces the deviation of the stress distribution generated in the connecting section 130 and reduces or prevents damage of the connecting section 130.

In the piezoelectric device 100c according to the third modification of Preferred Embodiment 1 of the present invention, when both of the pair of beam sections 120 are viewed from the first slit 141 side and the second slit 142 side, both of the pair of beam sections 120 are inclined toward one side in the laminating direction.

Also in this configuration, the piezoelectric device 100c according to the third modification of Preferred Embodiment 1 of the present invention has a smaller deviation in the stress distribution generated in the connecting section 130, thus reducing or preventing the occurrence of damage in the connecting section 130.

In the piezoelectric device 100 according to Preferred Embodiment 1 of the present invention, when viewed from the laminating direction, the angle between the extension direction of each of the plurality of beam sections 120 and the axial direction of the virtual axis is, for example, about 40 degrees or more and about 50 degrees or less or about 130 degrees or more and about 140 degrees or less.

Accordingly, even when thermal stress is generated in the plurality of beam sections 120, the plurality of beam sections 120 each have the same or substantially the same stress distribution in the extension direction, so that the degrees of warp of the plurality of beam sections 120 are also the same or substantially the same. This reduces or prevents deterioration of the device characteristics of the piezoelectric device 100.

In the present preferred embodiment, the piezoelectric layer 11 is made of, for example, lithium niobate ($LiNbO_3$) or lithium tantalate ($LiTaO_3$).

This can improve the piezoelectricity of the piezoelectric layer 11, thus improving the device characteristics of the piezoelectric device 100.

Preferred Embodiment 2

Hereinafter, a piezoelectric device according to Preferred Embodiment 2 of the present invention will be described. The piezoelectric device according to Preferred Embodiment 2 of the present invention is different from the piezoelectric device 100 according to Preferred Embodiment 1 of the present invention mainly in the number of beam sections. For this reason, the description of the configuration the same as or similar to that of the piezoelectric device 100 according to Preferred Embodiment 1 of the present invention will not be repeated.

Figure 20:
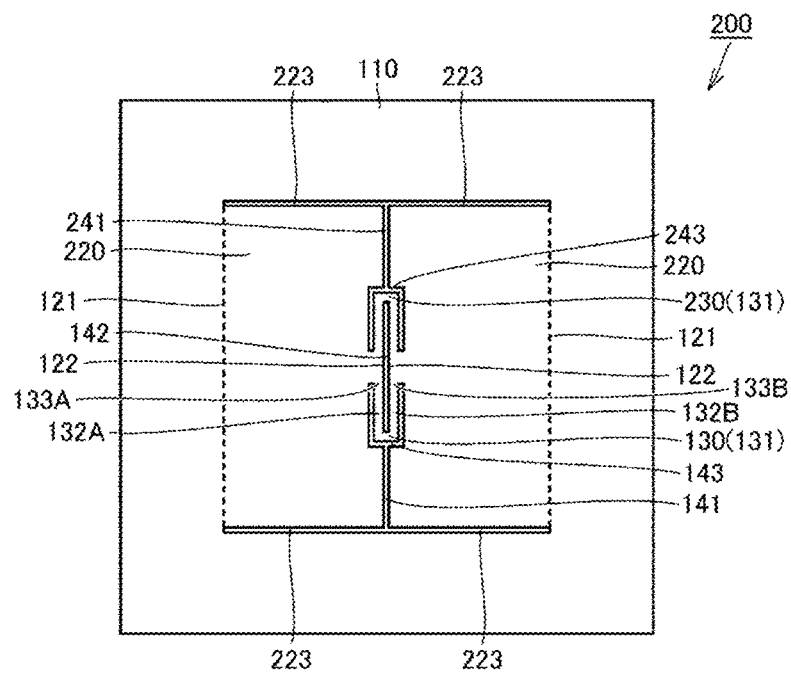
FIG. 20 is a plan view of a piezoelectric device according to Preferred Embodiment 2 of the present invention.

FIG. 20 is a plan view of the piezoelectric device according to Preferred Embodiment 2 of the present invention. As illustrated in FIG. 20, also in a piezoelectric device 200 according to Preferred Embodiment 2 of the present invention, the connecting section 130 connects a pair of beam sections 220 adjacent to each other of the plurality of beam sections 220. The first slit 141 and the second slit 142 are provided between the pair of beam sections 220. The first slit 141 is defined by portions of a pair of end edges adjacent to each other of the pair of beam sections 220. The second slit 142 is defined by other portions of the pair of end edges adjacent to each other of the pair of beam sections 220 at a position different from that of the first slit 141. The connecting section 130 is located at least between the first slit 141 and the second slit 142. The connecting section 130 includes the first end portion 133A, the second end portion 133B, the bridging portion 131, the first coupling portion 132A, and the second coupling portion 132B. The connecting section 130 is connected to one of the pair of beam sections 220 at the first end portion 133A. The connecting section 130 is connected to another of the pair of beam sections 220 at the second end portion 133B. The second end portion 133B faces the first end portion 133A in the direction in which the pair of beam sections 220 are aligned. The bridging portion 131 is provided in order to connect the pair of beam sections 120 while turning back between the pair of beam sections 220. The first coupling portion 132A is connected to a portion of the bridging portion 131 located on the side of the one of the pair of beam sections 220. The second coupling portion 132B is connected to a portion of the bridging portion 131 located on the side of the other of the pair of beam sections 220. The second coupling portion 132B is located along the first coupling portion 132A. The connecting section 130 includes only one first end portion 133A. The connecting section 130 includes only one second end portion 133B. Each of the first end portion 133A and the second end portion 133B is located closer to the tip end portion 122 than to the fixed end portion 121 of each of the pair of beam sections 220. This allows vibration variation of each of the plurality of beam sections 220 to be reduced or prevented while reducing or preventing an increase in the resonant frequency of each of the plurality of beam sections 220 during vibration.

The piezoelectric device 200 according to Preferred Embodiment 2 of the present invention includes two beam sections 220 as the plurality of beam sections 220. The two beam sections 220 are located such that the tip end portions 122 of the two beam sections 220 face each other. The first slit 141 and the second slit 142 are each located between the tip end portions 122 of the two beam sections 220. Thus, also in the piezoelectric device 200 including the two beam sections 220, the connecting section 130 can reduce or prevent the vibration variation of the two beam sections 220 while reducing or preventing an increase in the resonant frequency of each of the two beam sections 220 during vibration.

In the present preferred embodiment, more specifically, the first slit 141 is adjacent to each of portions of the tip end portions 122 of the two beam sections 220. The second slit 142 is adjacent to each of other portions of the tip end portions 122 of the two beam sections 220 at a position different from that of the first slit 141.

In the present preferred embodiment, the two beam sections 220 extend along the same or substantially the same direction as each other. The first slit 141 and the second slit 142 each specifically extend in a direction intersecting the extending direction of each of the two beam sections 220, and more specifically, extend in a direction orthogonal or substantially orthogonal to the extending direction of each of the two beam sections 220. This allows, also in the present preferred embodiment, the connecting section 130 to be provided with a simple configuration.

In the present preferred embodiment, the fixed end portion 121 and the tip end portion 122 of each of the two beam sections 220 are each located along the direction orthogonal or substantially orthogonal to the extending direction of each of the two beam sections 220. This simplifies the outer shapes of the two beam sections 220. Specifically, each of the two beam sections 220 has a rectangular or substantially rectangular outer shape when viewed from the laminating direction. Each of the two beam sections 220 includes a pair of side end portions 223. Each of the pair of side end portions 223 connects an end portion of the fixed end portion 121 and an end portion of the tip end portion 122 to each other. Each of the pair of side end portions 223 is spaced apart from the base 110.

The piezoelectric device 200 according to the present preferred embodiment further includes an additional connecting section 230. The additional connecting section 230 is disposed between the tip end portions 122 of the two beam sections 220 so as to be point-symmetric or substantially point-symmetric with the connecting section 130 about a virtual center point between the tip end portions 122 of the two beam sections 220. The additional connecting section 230 has a configuration the same as or similar to that of the connecting section 130. The portions defining the additional connecting section 230 are arranged so as to be point-symmetric or substantially point-symmetric with the portions defining the connecting section 130 about the virtual center point between the tip end portions 122.

Further, as illustrated in FIG. 20, an additional first slit 241 and an additional outer peripheral slit 243 are further provided between the two beam sections 220. The additional first slit 241 is disposed so as to be point-symmetric or substantially point-symmetric with the first slit 141 about the virtual center point between the tip end portions 122. The additional first slit 241 extends in the same or substantially the same direction as each of the first slit 141 and the second slit 142. Specifically, the additional first slit 241, the first slit 141, and the second slit 142 are located on the same or substantially the same virtual straight line when viewed from the laminating direction. The additional outer peripheral slit 243 is disposed so as to be point-symmetric or with the outer peripheral slit 143 about the virtual center point between the tip end portions 122.

In the present preferred embodiment, the relative positional relationship of each of the additional first slit 241, the second slit 142, and the additional outer peripheral slit 243 to the additional connecting section 230 is the same as or similar to the relative positional relationship of each of the first slit 141, the second slit 142, and the outer peripheral slit 143 to the connecting section 130.

Also in the present preferred embodiment, the axial direction of the polarization axis of the single crystal piezoelectric material of the piezoelectric layer is oriented in a specific direction. That is, the axial direction of the virtual axis when the polarization axis of the single crystal piezoelectric material is projected from the laminating direction onto the virtual plane orthogonal or substantially orthogonal to the laminating direction is also oriented in a specific direction. In the present preferred embodiment, an angle between the extending direction of each of the two beam sections 220 and the axial direction of the virtual axis when viewed from the laminating direction is, for example, about 0 degrees or more and about 5 degrees or less, about 85 degrees or more and about 95 degrees or less, or about 175 degrees or more and less than about 180 degrees. However, also in the present preferred embodiment, the axial directions of the polarization axis of the single crystal piezoelectric material and the virtual axis are not limited to the above-described specific directions, respectively.

Also in the present preferred embodiment, since the single crystal piezoelectric material has a polarization axis, thermal stress generated in the two beam sections 220 may cause each of the two beam sections 220 to be warped when viewed from the direction orthogonal or substantially orthogonal to the laminating direction. A modification in which each of the plurality of beam sections 220 is warped will be described below.

Figure 21:
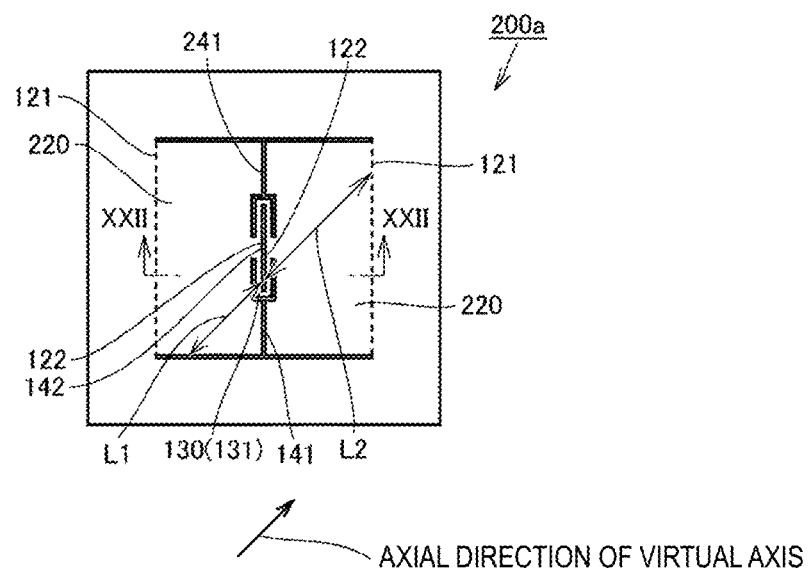
FIG. 21 is a plan view of a piezoelectric device according to a first modification of Preferred Embodiment 2 of the present invention.
Figure 22:
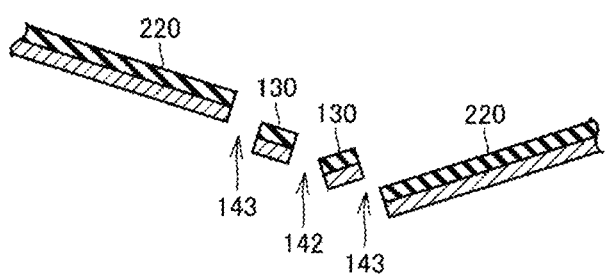
FIG. 22 is a partial sectional view of the piezoelectric device illustrated in FIG. 21 taken along line XXII-XXII.

FIG. 21 is a plan view of a piezoelectric device according to a first modification of Preferred Embodiment 2 of the present invention. FIG. 22 is a partial sectional view of the piezoelectric device illustrated in FIG. 21 taken along line XXII-XXII.

As illustrated in FIG. 21, in a piezoelectric device 200a according to the first modification of Preferred Embodiment 2 of the present invention, the angle between the axial direction of the virtual axis of the single crystal piezoelectric material and each of the first slit 141, the second slit 142, and the additional first slit 241 is, for example, about 45 degrees when viewed from the laminating direction.

Thus, in the first modification, a distance L1 from the center of the connecting section 130 to the opposite end portion of one beam section 220 of the two beam sections 220 and a distance L2 from the center of the connecting section 130 to the opposite end portion of another beam section 220 of the two beam sections 220 in the axial direction of the virtual axis when viewed from the laminating direction are different from each other. In addition, the end portion of the one beam section 220 of the two beam sections 220 located on the opposite side to the side of the center of the connecting section 130 in the axial direction of the virtual axis when viewed from the laminating direction is not the fixed end portion 121. On the other hand, the end portion of the other beam section 220 located on the side opposite to the side of the center of the connecting section 130 in the axial direction of the virtual axis when viewed from the laminating direction is the fixed end portion 121. Thus, when thermal stress is applied to the plurality of beam sections 220, the two beam sections 220 warp in different modes in the vicinity of the connecting section 130.

Further, in the piezoelectric device 200a according to the first modification, thermal stress is applied to the plurality of beam sections 220. As a result, as illustrated in FIG. 22, when the piezoelectric device 200a is not driven, the end portions of the two beam sections 220 in the vicinity of the center of the connecting section 130 are located at positions different from each other in the laminating direction.

Figure 23:
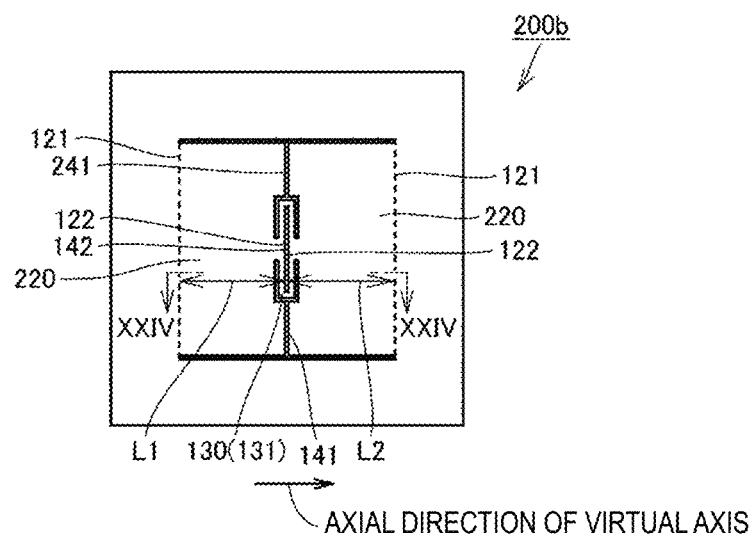
FIG. 23 is a plan view of a piezoelectric device according to a second modification of Preferred Embodiment 2 of the present invention.
Figure 24:
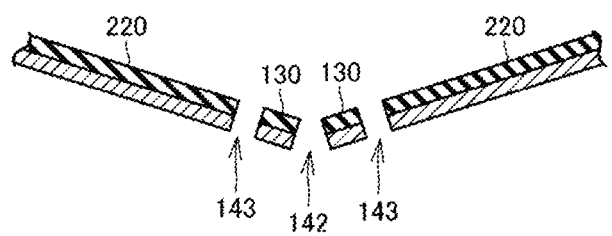
FIG. 24 is a partial sectional view of the piezoelectric device illustrated in FIG. 23 taken along line XXIV-XXIV.

FIG. 23 is a plan view of a piezoelectric device according to a second modification of Preferred 2 of the present invention. FIG. 24 is a partial sectional view of the piezoelectric device illustrated in FIG. 23 taken along line XXIV-XXIV.

As illustrated in FIG. 23, in a piezoelectric device 200b according to the second modification of Preferred Embodiment 2 of the present invention, the angle between the axial direction of the virtual axis of the single crystal piezoelectric material and each of the first slit 141, the second slit 142, and the additional first slit 241 is, for example, about 0 degrees or about 90 degrees when viewed from the laminating direction.

Thus, in the modification, a distance L1 from the center of the connecting section 130 to the opposite end portion of the one beam section 220 of the two beam sections 220 and a distance L2 from the center of the connecting section 130 to the opposite end portion of the other beam section 220 of the two beam sections 220 in the axial direction of the virtual axis when viewed from the laminating direction are equal or substantially equal to each other. In addition, in the axial direction of the virtual axis when viewed from the laminating direction, a distance from an end portion in the vicinity of the center of the connecting section 130 to the fixed end portion 121 in the one beam section 220 of the two beam sections 220 is equal or substantially equal to a distance from an end portion in the vicinity of the center of the connecting section 130 to the fixed end portion 121 in the other beam section 220.

Further, in the piezoelectric device 200b according to the second modification, each of the two beam sections 220 is warped due to thermal stress applied to the two beam sections 220. As a result, as illustrated in FIG. 24, when the piezoelectric device 200b is not driven, the end portions of the two beam sections 220 in the vicinity of the center of the connecting section 130 on the side of the connecting section 130 are located at the same or substantially the same position in the laminating direction. As described above, in the second modification, even when each of the plurality of beam sections 220 is warped due to thermal stress, since the pair of beam sections 220 are similarly deformed in the laminating direction, it is possible to reduce or prevent damage at the connecting section 130, particularly, the bridging portion 131.

As described above, by comparing the piezoelectric device 200a according to the first modification with the piezoelectric device 200b according to the second modification of Preferred Embodiment 2 of the present invention, the following can be seen. In Preferred Embodiment 2 of the present invention, when viewed from the laminating direction, the closer the angle between the axial direction of the virtual axis and the extending direction of each of the first slit 141 and the second slit 142 approaches about 0 degrees or about 90 degrees, compared to about 45 degrees or about 135 degrees, the more the difference in displacement of the two beam sections 220 due to thermal stress can be reduced or prevented. Similarly, in Preferred Embodiment 2 of the present invention, it can be seen that when viewed from the laminating direction, the closer the angle between the axial direction of the virtual axis and the extending direction of each of the two beam sections 220 approaches about 0 degrees or about 90 degrees, compared to about 45 degrees or about 135 degrees, the more the difference in displacement of the two beam sections in the laminating direction due to thermal stress can be reduced or prevented.

Preferred Embodiment 3

Hereinafter, a piezoelectric device according to Preferred Embodiment 3 of the present invention will be described. The piezoelectric device according to Preferred Embodiment 3 of the present invention is different from the piezoelectric device 200 according to Preferred Embodiment 2 of the present invention mainly in the configuration of each slit. For this reason, the description of the configuration the same as or similar to that of the piezoelectric device 200 according to Preferred Embodiment 2 of the present invention will not be repeated.

Figure 25:
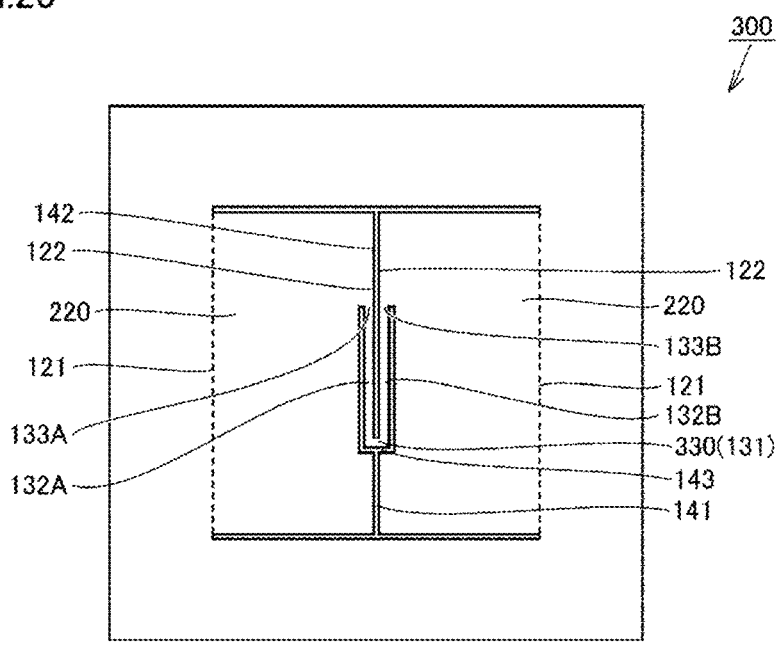
FIG. 25 is a plan view of a piezoelectric device according to Preferred Embodiment 3 of the present invention.

FIG. 25 is a plan view of the piezoelectric device according to Preferred Embodiment 3 of the present invention. As illustrated in FIG. 25, a piezoelectric device 300 according to Preferred Embodiment 3 of the present invention includes only one connecting section 330. That is, the piezoelectric device 300 according to Preferred Embodiment 3 of the present invention is not provided with the additional first slit and the additional outer peripheral slit provided in the piezoelectric device 200 according to Preferred Embodiment 2 of the present invention.

Also in the piezoelectric device 300 according to Preferred Embodiment 3 of the present invention, the connecting section 330 connects the pair of beam sections 220 adjacent to each other of the plurality of beam sections 220. The first slit 141 and the second slit 142 are provided between the pair of beam sections 220. The first slit 141 is defined by portions of the pair of end edges adjacent to each other of the pair of beam sections 220. The second slit 142 is defined by the other portions of the pair of end edges adjacent to each other of the pair of beam sections 220 at a position different from that of the first slit 141. The connecting section 330 is located at least between the first slit 141 and the second slit 142. The connecting section 330 includes the first end portion 133A, the second end portion 133B, the bridging portion 131, the first coupling portion 132A, and the second coupling portion 132B. The connecting section 330 is connected to the one of the pair of beam sections 220 at the first end portion 133A. The connecting section 330 is connected to the other of the pair of beam sections 220 at the second end portion 133B. The second end portion 133B faces the first end portion 133A in the direction in which the pair of beam sections 220 are aligned. The bridging portion 131 is provided in order to connect the pair of beam sections 220 while turning back between the pair of beam sections 220. The first coupling portion 132A is connected to the portion of the bridging portion 131 located on the side of the one of the pair of beam sections 220. The second coupling portion 132B is connected to the portion of the bridging portion 131 located on the side of the other of the pair of beam sections 220. The second coupling portion 132B is located along the first coupling portion 132A. The connecting section 330 includes only one first end portion 133A. The connecting section 330 includes only one second end portion 133B. Each of the first end portion 133A and the second end portion 133B is located closer to the tip end portion 122 than to the fixed end portion 121 of each of the pair of beam sections 220. This allows the vibration variation of the plurality of beam sections 220 to be reduced or prevented while reducing or preventing an increase in the resonant frequency of each of the plurality of beam sections 220 during vibration.

Preferred Embodiment 4

Hereinafter, a piezoelectric device according to Preferred Embodiment 4 of the present invention will be described. The piezoelectric device according to Preferred Embodiment 4 of the present invention is different from the piezoelectric device 100 according to Preferred Embodiment 1 of the present invention in that the dimensions of the extension length, the minimum width, and the thickness of each of the first coupling portion and the second coupling portion are defined. For this reason, the description of the configuration similar to that of the piezoelectric device 100 according to Preferred Embodiment 1 of the present invention will not be repeated.

Figure 26:
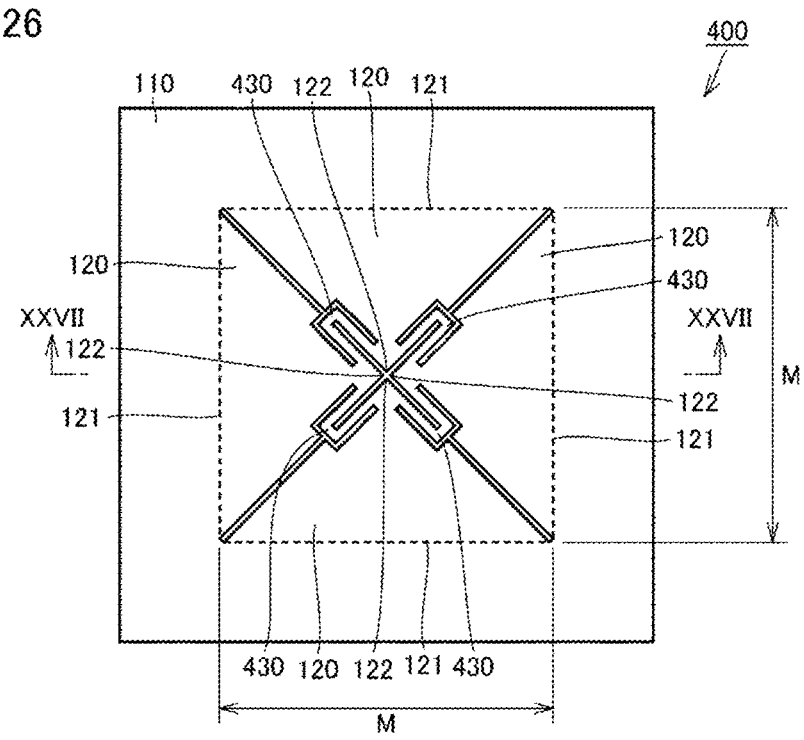
FIG. 26 is a plan view of a piezoelectric device according to Preferred Embodiment 4 of the present invention.
Figure 27:
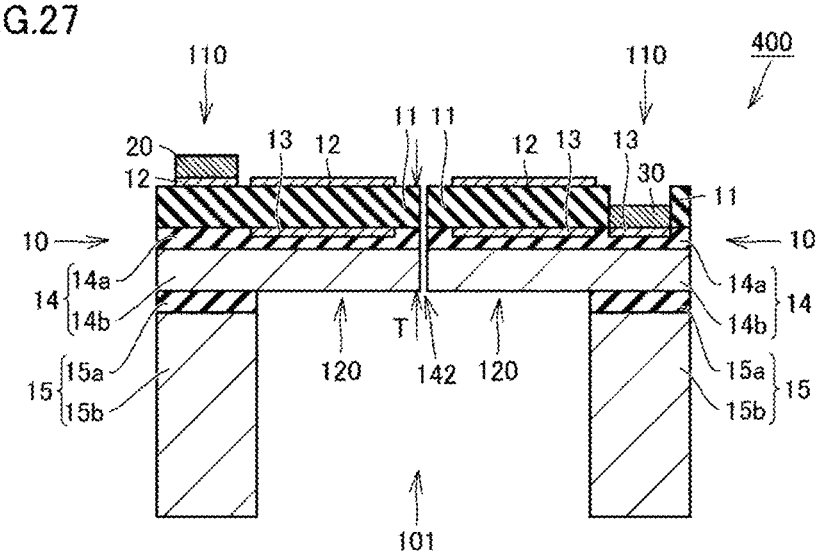
FIG. 27 is a sectional view of the piezoelectric device illustrated in FIG. 26 taken along line XXVII-XXVII.
Figure 28:
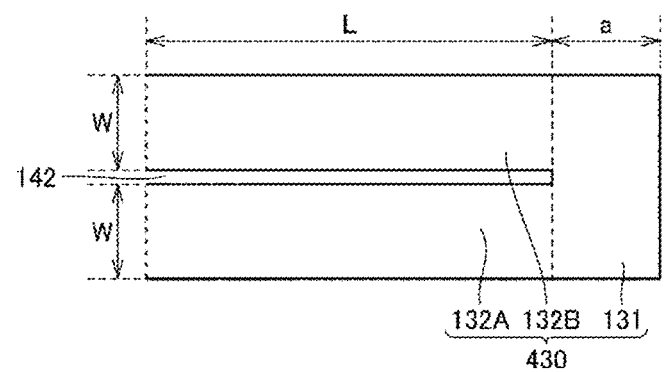
FIG. 28 is a partial plan view illustrating a configuration of a connecting section of the piezoelectric device according to Preferred Embodiment 4 of the present invention.

FIG. 26 is a plan view of the piezoelectric device according to Preferred Embodiment 4 of the present invention. FIG. 27 is a sectional view of the piezoelectric device illustrated in FIG. 26 taken along line XXVII-XXVII. FIG. 28 is a partial plan view illustrating a configuration of a connecting section of the piezoelectric device according to Preferred Embodiment 4 of the present invention. In FIG. 27, each layer is illustrated thicker for clarity.

As illustrated in FIGS. 26 to 28, a piezoelectric device 400 according to Preferred Embodiment 4 of the present invention includes the base 110, the four beam sections 120, and four connecting sections 430. The fixed end portions 121 of the four beam sections 120 are located so as to form a square when viewed from the laminating direction. The dimension of a shortest distance M between the fixed end portions 121 facing each other among the fixed end portions 121 of the four beam sections 120 when viewed from the laminating direction illustrated in FIG. 26 is a dimension measured along a straight line that passes through the fixed end portion 121 and the tip end portion 122 of the beam section 120 including one fixed end portion 121 of the fixed end portions 121 facing each other in the shortest distance.

The connecting section 430 connects the pair of beam sections 120 adjacent to each other among the four beam sections 120. The connecting section 430 includes the bridging portion 131, the first coupling portion 132A, and the second coupling portion 132B.

In the present preferred embodiment, each of the first coupling portion 132A, the second coupling portion 132B, and the bridging portion 131 linearly extends while having a constant or substantially constant width. The dimension of the minimum width W of each of the first coupling portion 132A and the second coupling portion 132B is equal or substantially equal to the dimension of the maximum width a of the bridging portions 131.

In the piezoelectric device 400, when the force to connect the beam sections 120 by the connecting section 430 is too weak, the coupled vibration mode is likely to occur. The ease of occurrence of the coupled vibration mode can be quantified by the resonant frequency of the coupled vibration mode and the resonant frequency of the fundamental mode of vibration. The further apart these resonant frequencies are, the more the coupled vibration mode is reduced or prevented.

Here, the resonant frequency of the coupled vibration mode varies depending on the ratio of flexural rigidities of the four beam sections 120 and the four connecting sections 430 in an out-of-plane direction. In each of the beam section 120 and the connecting section 430, the flexural rigidity mainly depends on parameters such as, for example, thickness and length as well as hardnesses and densities of materials.

The four beam sections 120 and the four connecting sections 430 are different from each other in that the beam section 120 includes the first electrode layer 12 and the connecting section 430 does not include the first electrode layer 12. However, since the beam section 120 and the connecting section 430 have the same or substantially the same laminated structure, the thicknesses, hardnesses, and densities of the beam section 120 and the connecting section 430 are the same or substantially the same, and the ratio of the flexural rigidities greatly varies depending on the difference in length. That is, the resonant frequency of the coupled vibration mode can be varied by adjusting the ratio of the dimension of the extension length L of each of the first coupling portion 132A and the second coupling portion 132B to the dimension of the shortest distance M between the fixed end portions 121.

In general, in an acoustic device using the flexural vibration of the thin beam section 120 as in the present preferred embodiment, a Q value at resonance is reduced or prevented to approximately 10 due to the load by air resistance. This allows, for example, more than half of the energy at resonance to be input to the piezoelectric device 400 even when the piezoelectric device 400 is used at a frequency shifted by about ±5% from the resonant frequency, thus widening the usable band. In particular, when the piezoelectric device 400 is manufactured in large quantities by micro-electro-mechanical systems (MEMS) processing, the resonant frequency may vary by about ±5% due to the processing accuracy of the MEMS. However, in the piezoelectric device 400 having a wide usable band as described above, it is possible to reduce or prevent a large variation in the characteristics of the piezoelectric device 400.

However, when the resonant frequency of the coupled vibration mode exists within the above-described usable band, the energy input to the piezoelectric device 400 is absorbed as the vibration energy of the coupled vibration mode, instead of the fundamental mode of vibration. In this case, conversion efficiency of the piezoelectric device 400 is lowered, and the Q value of the coupled vibration mode is high, resulting in a longer reverberant vibration after the drive of the piezoelectric device 400 is stopped.

In view of this problem, it is preferable that the resonant frequency of the coupled vibration mode is higher than the resonant frequency of the fundamental mode of vibration by, for example, about 5% or more. Thus, simulation analysis was performed for different dimensions of the minimum width W of each of the first coupling portion 132A and the second coupling portion 132B to determine the relationship between the ratio of the dimension of the extension length L of each of the first coupling portion 132A and the second coupling portion 132B to the dimension of the shortest distance M between the fixed end portions 121, and the ratio of the difference between a secondary resonant frequency and a primary resonant frequency to the primary resonant frequency in each of the four beam sections 120. The primary resonant frequency corresponds to the resonant frequency of the fundamental mode of vibration, and the secondary resonant frequency corresponds to the resonant frequency of the coupled vibration mode.

As simulation analysis conditions, in the piezoelectric device 400 according to the present preferred embodiment, the dimension of the shortest distance M between the fixed end portions 121 was about 800 μm, the dimension of the thickness of the piezoelectric layer 11 was about 1 μm, and the thickness of the support layer 14 was about 2 μm. That is, the dimension of the thickness T illustrated in FIG. 27 was set to about 3 μm. The thickness T corresponds to the thickness of each of the first coupling portion 132A and the second coupling portion 132B in the laminating direction. The dimension of the minimum width W of each of the first coupling portion 132A and the second coupling portion 132B was set to three different widths of about 10 μm, about 15 μm, and about 20 μm.

Figure 29:
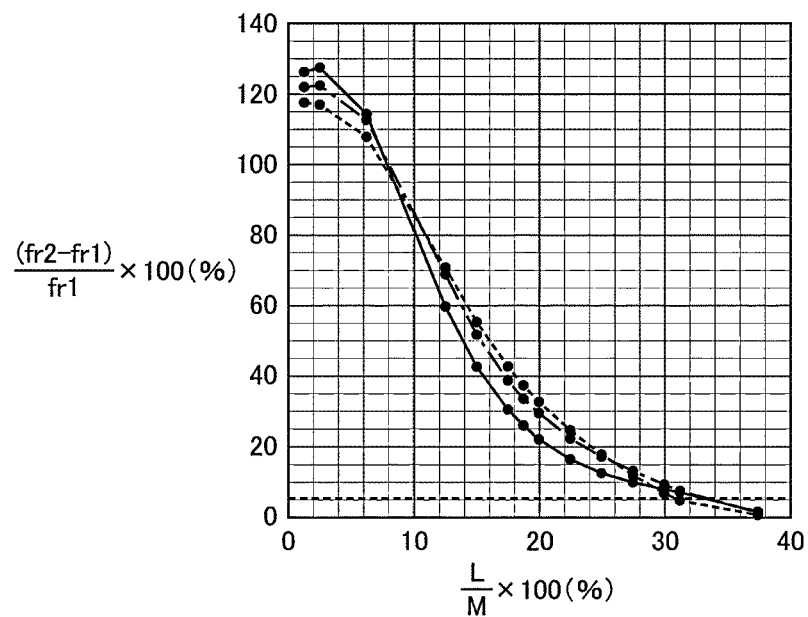
FIG. 29 is a graph showing the results of simulation analysis.

FIG. 29 is a graph showing the results of simulation analysis. In FIG. 29, the vertical axis represents the ratio (%) of the difference between the secondary resonant frequency fr2 and the primary resonant frequency fr1 to the primary resonant frequency fr1 in each of the four beam sections 120, and the horizontal axis represents the ratio (%) of the dimension of the extension length L of each of the first coupling portion 132A and the second coupling portion 132B to the dimension of the shortest distance M between the fixed end portions 121. The data when the dimensions of the minimum width W of each of the first coupling portion 132A and the second coupling portion 132B are about 10 μm, about 15 μm, and about 20 μm are shown as a solid line, an alternate long and short dash line, and a dotted line, respectively. Further, a reference line in which the ratio of the difference between the secondary resonant frequency fr2 and the primary resonant frequency fr1 to the primary resonant frequency fr1 in each of the four beam sections is about 5% is indicated by a dotted line.

As shown in FIG. 29, a tendency was observed that as the ratio of the dimension of the extension length L of each of the first coupling portion 132A and the second coupling portion 132B to the dimension of the shortest distance M between the fixed end portions 121 [(L/M)×100(%)] increases, the ratio of the difference between the secondary resonant frequency fr2 and the primary resonant frequency fr1 to the primary resonant frequency fr1 in each of the four beam sections 120 [(fr2−fr1)/fr1×100(%)] decreases.

When the ratio of the dimension of the extension length L of each of the first coupling portion 132A and the second coupling portion 132B to the dimension of the shortest distance M between the fixed end portions 121 [(L/M)×100 (%)] is about 30% or less, the ratio of the difference between the secondary resonant frequency fr2 and the primary resonant frequency fr1 to the primary resonant frequency fr1 in each of the four beam sections 120 [(fr2−fr1)/fr1×100(%)] is about 5% or more in all of the dimensions of the minimum width W of each of the first connecting portion 132A and the second connecting portion 132B of about 10 μm, about 15 μm, and about 20 μm.

Thus, in the present preferred embodiment, when viewed from the laminating direction, the ratio of the dimension of the extension length L of each of the first coupling portion 132A and the second coupling portion 132B to the dimension of the shortest distance M between the fixed end portions 121 facing each other among the fixed end portions 121 of the four beam sections 120 is about 30% or less. This makes it possible to reduce or prevent the generation of the coupled vibration mode, thus reducing or preventing a decrease in the conversion efficiency of the piezoelectric device 400 and a long reverberant vibration after the drive of the piezoelectric device 400 is stopped.

As described above, the resonant frequency of the coupled vibration mode varies depending on the ratio of the flexural rigidities of the four beam sections 120 and the four connecting sections 430 in the out-of-plane direction. When the dimension of the minimum width W of each of the first coupling portion 132A and the second coupling portion 132B is smaller than the dimension of the thickness T of each of the first coupling portion 132A and the second coupling portion 132B in the laminating direction, the flexural rigidities of the four beam sections 120 and the four connecting sections 430 in the in-plane direction are lower than the flexural rigidities in the out-of-plane direction. In this case, the resonant frequency of the coupled vibration mode is close to the resonant frequency of the fundamental mode of vibration, and it may be difficult to secure [(fr2−fr1)/fr1)×100(%)] by about 5% or more.

Thus, in the present preferred embodiment, the dimension of the minimum width W of each of the first coupling portion 132A and the second coupling portion 132B is larger than the dimension of the thickness T of each of the first coupling portion 132A and the second coupling portion 132B in the laminating direction. This makes it possible to suppress the generation of the coupled vibration mode, thereby suppressing a decrease in the conversion efficiency of the piezoelectric device 400 and a long reverberant vibration after the drive of the piezoelectric device 400 is stopped.

The shape of the connecting section 430 to which the limitation by the above parameters is applicable is not limited to the above-described shape. Here, shapes of connecting sections according to modifications to which the limitation by the above parameters is applicable will be described. In the following description of the modifications, the description of the same or substantially the same configuration as that of the connecting section 430 of the piezoelectric device 400 according to Preferred Embodiment 4 of the present invention will not be repeated.

Figure 30:
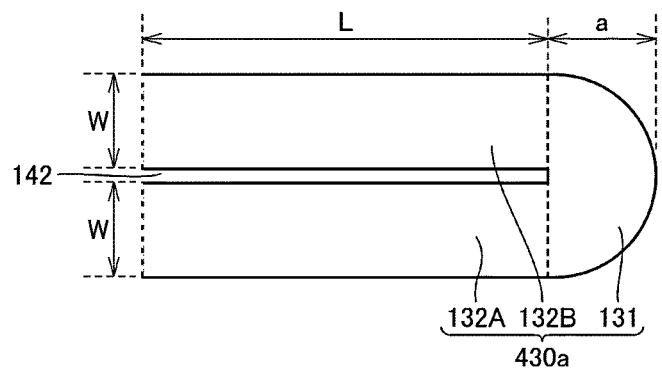
FIG. 30 is a partial plan view illustrating the shape of a connecting section of a piezoelectric device according to a first modification of Preferred Embodiment 4 of the present invention.

FIG. 30 is a partial plan view illustrating the shape of a connecting section of a piezoelectric device according to a first modification of Preferred Embodiment 4 of the present invention. As illustrated in FIG. 30, in the first modification of Preferred Embodiment 4 of the present invention, the bridging portion 131 in a connecting section 430a has a semicircular or substantially semicircular shape with a radius a centered at the tip of the second slit 142. The dimension of the minimum width W of each of the first coupling portion 132A and the second coupling portion 132B is equal or substantially equal to the dimension of the maximum width a of the bridging portions 131.

Figure 31:
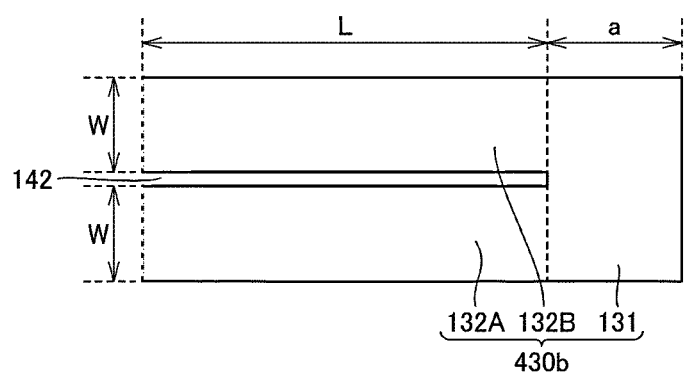
FIG. 31 is a partial plan view illustrating the shape of a connecting section of a piezoelectric device according to a second modification of Preferred Embodiment 4 of the present invention.

FIG. 31 is a partial plan view illustrating the shape of a connecting section of a piezoelectric device according to a second modification of Preferred Embodiment 4 of the present invention. As illustrated in FIG. 31, in the second modification of Preferred Embodiment 4 of the present invention, each of the first coupling portion 132A, the second coupling portion 132B, and the bridging portion 131 in a connecting section 430b linearly extends while having a constant or substantially constant width. The dimension of the minimum width W of each of the first coupling portion 132A and the second coupling portion 132B is smaller than the dimension of the maximum width a of the bridging portion 131. The dimension of the maximum width a of the bridging portion 131 is equal to or less than about twice the dimension of the minimum width W of each of the first coupling portion 132A and the second coupling portion 132B.

Figure 32:
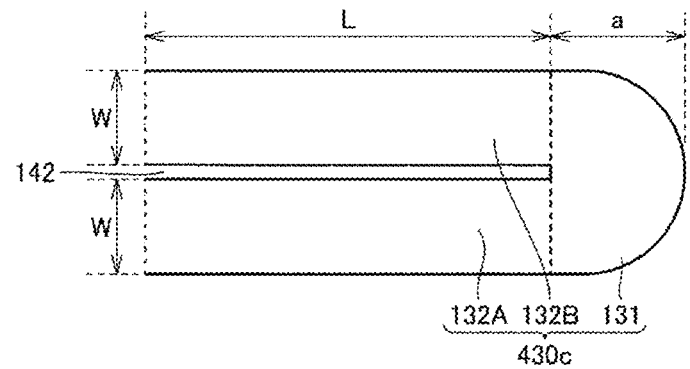
FIG. 32 is a partial plan view illustrating the shape of a connecting section of a piezoelectric device according to a third modification of Preferred Embodiment 4 of the present invention.

FIG. 32 is a partial plan view illustrating the shape of a connecting section of a piezoelectric device according to a third modification of Preferred Embodiment 4 of the present invention. As illustrated in FIG. 32, in the third modification of Preferred Embodiment 4 of the present invention, the bridging portion 131 in a connecting section 430c has a semicircular or substantially semicircular shape with a radius a centered at the tip of the second slit 142. The dimension of the minimum width W of each of the first coupling portion 132A and the second coupling portion 132B is smaller than the dimension of the maximum width a of the bridging portion 131. The dimension of the maximum width a of the bridging portion 131 is equal to or less than about twice the dimension of the minimum width W of each of the first coupling portion 132A and the second coupling portion 132B.

Figure 33:
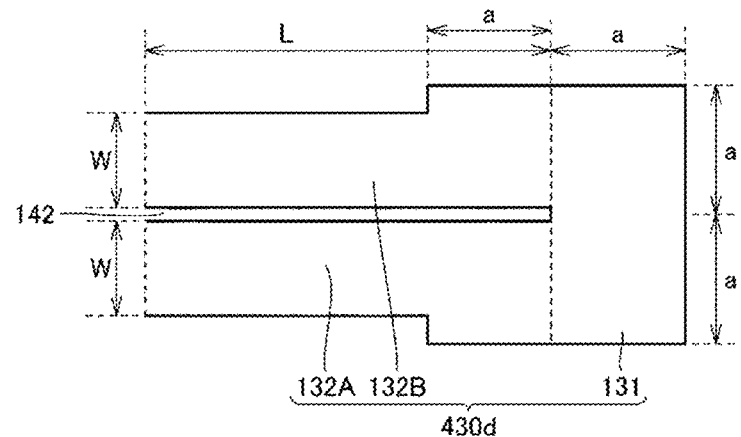
FIG. 33 is a partial plan view illustrating the shape of a connecting section of a piezoelectric device according to a fourth modification of Preferred Embodiment 4 of the present invention.

FIG. 33 is a partial plan view illustrating the shape of a connecting section of a piezoelectric device according to a fourth modification of Preferred Embodiment 4 of the present invention. As illustrated in FIG. 33, in the fourth modification of Preferred Embodiment 4 of the present invention, each of bridging portion side portions of the first coupling portion 132A and the second coupling portion 132B and the bridging portion 131 in a connecting section 430d has a shape along a virtual square with a side length of 2a centered at the tip of the second slit 142. The dimension of the minimum width W of each of the first coupling portion 132A and the second coupling portion 132B is smaller than the dimension of the maximum width a of the bridging portion 131. The dimension of the maximum width a of the bridging portion 131 is equal to or less than about twice the dimension of the minimum width W of each of the first coupling portion 132A and the second coupling portion 132B.

Figure 34:
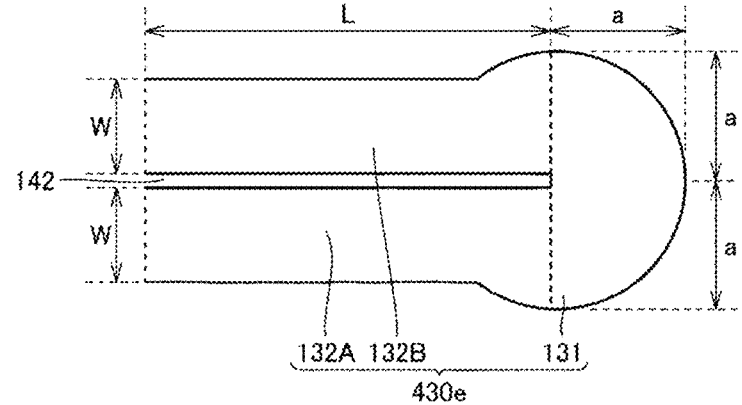
FIG. 34 is a partial plan view illustrating the shape of a connecting section of a piezoelectric device according to a fifth modification of Preferred Embodiment 4 of the present invention.

FIG. 34 is a partial plan view illustrating the shape of a connecting section of a piezoelectric device according to a fifth modification of Preferred Embodiment 4 of the present invention. As illustrated in FIG. 34, in the fifth modification of Preferred Embodiment 4 of the present invention, each of bridge portion side portions of the first coupling portion 132A and the second coupling portion 132B and the bridging portion 131 in a connecting section 430e has a shape along a virtual circle with a radius a centered at the tip of the second slit 142. The dimension of the minimum width W of each of the first coupling portion 132A and the second coupling portion 132B is smaller than the dimension of the maximum width a of the bridging portion 131. The dimension of the maximum width a of the bridging portion 131 is equal to or less than about twice the dimension of the minimum width W of each of the first coupling portion 132A and the second coupling portion 132B.

Figure 35:
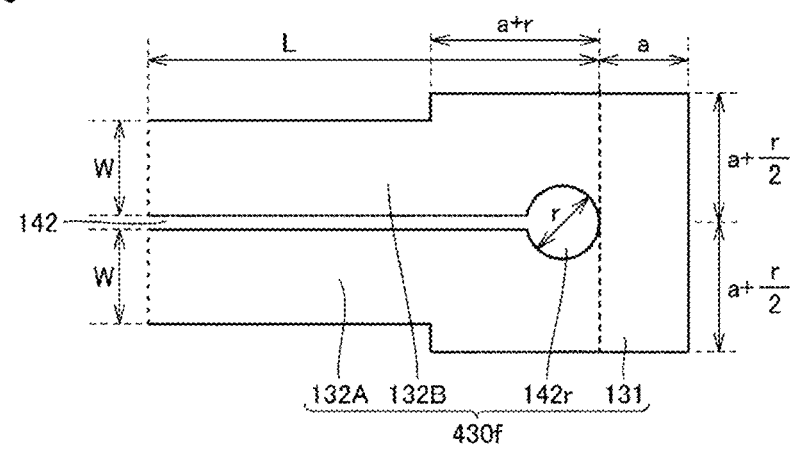
FIG. 35 is a partial plan view illustrating the shape of a connecting section of a piezoelectric device according to a sixth modification of Preferred Embodiment 4 of the present invention.

FIG. 35 is a partial plan view illustrating the shape of a connecting section of a piezoelectric device according to a sixth modification of Preferred Embodiment 4 of the present invention. As illustrated in FIG. 35, in the sixth modification of Preferred Embodiment 4 of the present invention, a circular or substantially circular opening 142r having a diameter r is provided at the tip of the second slit 142. The dimension of the diameter r is larger than the dimension of the width of the second slit 142 and is equal to or smaller than the dimension of the minimum width W of each of the first coupling portion 132A and the second coupling portion 132B. Each of bridging portion side portions of the first coupling portion 132A and the second coupling portion 132B and the bridging portion 131 in a connecting section 430f has a shape along a virtual square with a side length of (2a+r) centered at the center of the opening 142r. The dimension of the minimum width W of each of the first coupling portion 132A and the second coupling portion 132B is equal to or smaller than the dimension of the maximum width a of the bridging portion 131. The dimension of the maximum width a of the bridging portion 131 is equal to or less than about twice the dimension of the minimum width W of each of the first coupling portion 132A and the second coupling portion 132B.

Figure 36:
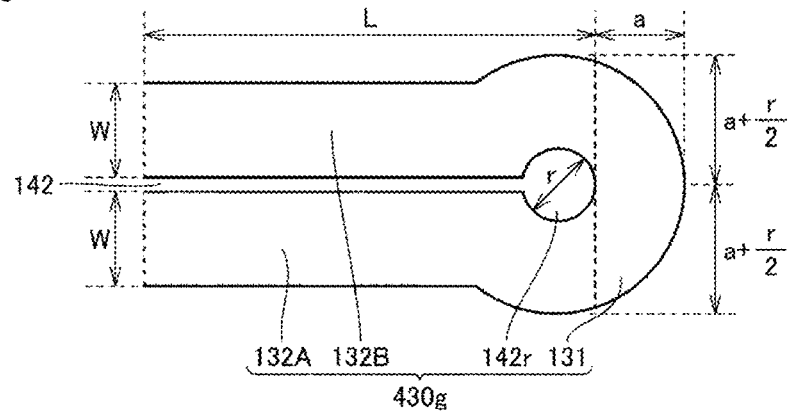
FIG. 36 is a partial plan view illustrating the shape of a connecting section of a piezoelectric device according to a seventh modification of Preferred Embodiment 4 of the present invention.

FIG. 36 is a partial plan view illustrating the shape of a connecting section of a piezoelectric device according to a seventh modification of Preferred Embodiment 4 of the present invention. As illustrated in FIG. 36, in the seventh modification of Preferred Embodiment 4 of the present invention, the circular or substantially circular opening 142r having the diameter r is provided at the tip of the second slit 142. The dimension of the diameter r is larger than the dimension of the width of the second slit 142 and is equal to or smaller than the dimension of the minimum width W of each of the first coupling portion 132A and the second coupling portion 132B. Each of bridging portion side portions of the first coupling portion 132A and the second coupling portion 132B and the bridging portion 131 in a connecting section 430g has a shape along a virtual circle with a radius of (a+r/2) centered at the center of the opening 142r. The dimension of the minimum width W of each of the first coupling portion 132A and the second coupling portion 132B is equal to or smaller than the dimension of the maximum width a of the bridging portion 131. The dimension of the maximum width a of the bridging portion 131 is equal to or less than about twice the dimension of the minimum width W of each of the first coupling portion 132A and the second coupling portion 132B.

In the description of the preferred embodiments described above, configurations that can be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a base;
a plurality of beam sections each of which includes a fixed end portion connected to the base and a tip end portion on a side opposite to the fixed end portion and extending from the fixed end portion toward the tip end portion; and
a connecting section connecting a pair of beam sections adjacent to each other of the plurality of beam sections; wherein
each of the plurality of beam sections is a piezoelectric vibrating section including a plurality of layers;
a first slit defined by portions of a pair of end edges adjacent to each other of the pair of beam sections and a second slit defined by other portions of the pair of end edges adjacent to each other of the pair of beam sections at a position different from a position of the first slit are provided between the pair of beam sections;
the connecting section is located at least between the first slit and the second slit;
the connecting section includes a first end portion connected to one of the pair of beam sections, a second end portion connected to another of the pair of beam sections and facing the first end portion in a direction in which the pair of beam sections are aligned, a bridging portion connecting the pair of beam sections while turning back between the pair of beam sections, a first coupling portion connected to a portion of the bridging portion on a side of the one of the pair of beam sections, and a second coupling portion connected to a portion of the bridging portion on a side of the another of the pair of beam sections and which is located along the first coupling portion;
the connecting section includes only one first end portion and only one second end portion; and
each of the first end portion and the second end portion is closer to the tip end portion than to the fixed end portion of each of the pair of beam sections.

2. The piezoelectric device according to claim 1, wherein an outer peripheral slit is defined between the pair of beam sections by an end edge on an outer peripheral side of a turn of the connecting section at the bridging portion and end edges of the pair of beam sections;
the first slit is connected to the outer peripheral slit; and
the second slit is located on an inner peripheral side of the turn of the connecting section at the bridging portion.

3. The piezoelectric device according to claim 1, wherein
the first coupling portion extends along the second slit starting from the first end portion; and
the second coupling portion extends along the second slit starting from the second end portion.

4. The piezoelectric device according to claim 3, wherein
the first coupling portion is directly connected to the bridging portion on a side opposite to a first end portion side; and
the second coupling portion is directly connected to the bridging portion on a side opposite to a second end portion side.

5. The piezoelectric device according to claim 3, wherein a dimension of an extension length of each of the first coupling portion and the second coupling portion is larger than a dimension of a minimum width of each of the first coupling portion and the second coupling portion in a direction orthogonal or substantially orthogonal to a direction along a path in which each of the first coupling portion and the second coupling portion extends toward a connection location with the bridging portion when viewed from a laminating direction of the plurality of layers.

6. The piezoelectric device according to claim 3, wherein a dimension of an extension length of each of the first coupling portion and the second coupling portion, which is a length of a path in which each of the first coupling portion and the second coupling portion extends toward a connection location with the bridging portion, is larger than a dimension of a shortest length from the connecting section to the tip end portion when viewed from a laminating direction of the plurality of layers.

7. The piezoelectric device according to claim 3, wherein a dimension of an extension length of each of the first coupling portion and the second coupling portion, which is a length of a path in which each of the first coupling portion and the second coupling portion extends toward a connection location with the bridging portion, is larger than a dimension of a maximum width of the bridging portion in a direction orthogonal or substantially orthogonal to a direction in which the pair of beam sections face each other when viewed from a laminating direction of the plurality of layers.

8. The piezoelectric device according to claim 3, wherein a dimension of a maximum width of the bridging portion in a direction orthogonal or substantially orthogonal to a direction in which the pair of beam sections face each other is larger than a dimension of a minimum width of each of the first coupling portion and the second coupling portion in a direction orthogonal to a direction along a path in which each of the first coupling portion and the second coupling portion extends toward a connection location with the bridging portion when viewed from a laminating direction of the plurality of layers.

9. The piezoelectric device according to claim 1, wherein
the first slit is located on a fixed end portion side of each of the pair of beam sections with respect to the bridging portion; and
the second slit is located on a tip end portion side of each of the pair of beam sections with respect to the bridging portion.

10. The piezoelectric device according to claim 1, wherein
the plurality of beam sections include four beam sections;
the connecting section includes four connecting sections;
the four beam sections are each located along the same or substantially the same plane;
the four beam sections each extend toward a virtual center point and are adjacent to each other in a circumferential direction around the virtual center point; and
each of the four connecting sections is located between a pair of beam sections adjacent to each other among the four beam sections and connects the pair of beam sections adjacent to each other.

11. The piezoelectric device according to claim 1, wherein
the plurality of beam sections include two beam sections;
the two beam sections are located such that the tip end portions of the two beam sections face each other, and
the first slit and the second slit are each located between the tip end portions of the two beam sections.

12. The piezoelectric device according to claim 11, wherein
both of the two beam sections extend along one direction; and
the first slit and the second slit each extend in a direction orthogonal or substantially orthogonal to the direction along which each of the two beam sections extends.

13. The piezoelectric device according to claim 12, wherein the fixed end portion and the tip end portion are each located along the direction orthogonal or substantially orthogonal to the direction along which each of the two beam sections extends.

14. The piezoelectric device according to claim 1, wherein
the plurality of layers include:
a piezoelectric layer made of a single crystal piezoelectric material;
a first electrode layer on one side of the piezoelectric layer in a laminating direction of the plurality of layers; and
a second electrode layer on another side of the piezoelectric layer so as to face at least a portion of the first electrode layer with the piezoelectric layer interposed therebetween; and
an axial direction of a virtual axis when a polarization axis of the single crystal piezoelectric material is projected from the laminating direction onto a virtual plane orthogonal or substantially orthogonal to the laminating direction extends in the same or substantially the same direction in all of the plurality of beam sections, and an angle between the axial direction of the virtual axis and an extending direction of each of the first slit and the second slit when viewed from the laminating direction is not about 45 degrees.

15. The piezoelectric device according to claim 14, wherein the angle between the axial direction of the virtual axis and the extending direction of each of the first slit and the second slit when viewed from the laminating direction is about 0 degrees or more and about 5 degrees or less, about 85 degrees or more and about 95 degrees or less, or about 175 degrees or more and less than about 180 degrees.

16. The piezoelectric device according to claim 14, wherein, when both of the pair of beam sections are viewed from a first slit side and a second slit side, both of the pair of beam sections are inclined toward one side in the laminating direction.

17. The piezoelectric device according to claim 14, wherein an angle between an extension direction of each of the plurality of beam sections when viewed from the laminating direction and the axial direction of the virtual axis when viewed from the laminating direction is about 40 degrees or more and about 50 degrees or less or about 130 degrees or more and about 140 degrees or less.

18. The piezoelectric device according to claim 14, wherein the piezoelectric layer is made of lithium niobate or lithium tantalate.

19. The piezoelectric device according to claim 10, wherein
- the fixed end portions of the four beam sections have a square or substantially square shape when viewed from a laminating direction; and
- when viewed from the laminating direction, a ratio of a dimension of an extension length of each of the first coupling portion and the second coupling portion to a dimension of a shortest distance between the fixed end portions facing each other among the fixed end portions of the four beam sections is about 30% or less.

20. The piezoelectric device according to claim 1, wherein a dimension of a minimum width of each of the first coupling portion and the second coupling portion is larger than a dimension of a thickness of each of the first coupling portion and the second coupling portion in a laminating direction.

* * * * *